(12) United States Patent
Lin et al.

(10) Patent No.: US 12,319,564 B2
(45) Date of Patent: Jun. 3, 2025

(54) SEMICONDUCTOR DEVICE AND METHOD OF FORMING MICROELECTROMECHANICAL SYSTEMS (MEMS) PACKAGE

(71) Applicant: STATS ChipPAC Pte. Ltd., Singapore (SG)

(72) Inventors: Yaojian Lin, Jiangyin (CN); Won Kyoung Choi, Singapore (SG); Kang Chen, Singapore (SG); Ivan Micallef, Veurey-Voroize (FR)

(73) Assignee: STATS ChipPAC Pte. Ltd., Singapore (SG)

( * ) Notice: Subject to any disclaimer, the term of this patent is extended or adjusted under 35 U.S.C. 154(b) by 466 days.

(21) Appl. No.: 17/664,789

(22) Filed: May 24, 2022

(65) Prior Publication Data
US 2022/0289560 A1   Sep. 15, 2022

Related U.S. Application Data

(60) Continuation of application No. 16/825,567, filed on Mar. 20, 2020, now Pat. No. 11,370,655, which is a
(Continued)

(51) Int. Cl.
*B81B 7/00* (2006.01)
*B81C 1/00* (2006.01)
(Continued)

(52) U.S. Cl.
CPC ............ *B81B 7/007* (2013.01); *B81C 1/0023* (2013.01); *B81C 1/00301* (2013.01);
(Continued)

(58) Field of Classification Search
CPC ... B81B 7/007; B81B 2207/092; H01L 24/97; H01L 2924/181; H01L 2924/18162;
(Continued)

(56) References Cited

U.S. PATENT DOCUMENTS

| | | |
|---|---|---|
| 3,754,514 A | 8/1973 | Peterson et al. |
| 6,313,522 B1 | 11/2001 | Akram et al. |

(Continued)

*Primary Examiner* — Walter H Swanson
*Assistant Examiner* — Jacob T Nelson
(74) *Attorney, Agent, or Firm* — Brian M. Kaufman; Robert D. Atkins; PATENT LAW GROUP: Atkins and Associates, P.C.

(57) ABSTRACT

A semiconductor device has a first semiconductor die and a modular interconnect structure adjacent to the first semiconductor die. An encapsulant is deposited over the first semiconductor die and modular interconnect structure as a reconstituted panel. An interconnect structure is formed over the first semiconductor die and modular interconnect structure. An active area of the first semiconductor die remains devoid of the interconnect structure. A second semiconductor die is mounted over the first semiconductor die with an active surface of the second semiconductor die oriented toward an active surface of the first semiconductor die. The reconstituted panel is singulated before or after mounting the second semiconductor die. The first or second semiconductor die includes a microelectromechanical system. The second semiconductor die includes an encapsulant and an interconnect structure formed over the second semiconductor die. Alternatively, the second semiconductor die is mounted to an interposer disposed over the interconnect structure.

21 Claims, 20 Drawing Sheets

Related U.S. Application Data continuation of application No. 16/169,817, filed on Oct. 24, 2018, now Pat. No. 10,662,056, which is a continuation of application No. 15/362,199, filed on Nov. 28, 2016, now Pat. No. 10,189,702, which is a division of application No. 14/643,074, filed on Mar. 10, 2015, now Pat. No. 9,527,723.

(60) Provisional application No. 61/952,620, filed on Mar. 13, 2014.

(51) Int. Cl.
| | |
|---|---|
| *H01L 21/56* | (2006.01) |
| *H01L 23/00* | (2006.01) |
| *H01L 23/538* | (2006.01) |
| *H01L 23/552* | (2006.01) |
| *H01L 25/00* | (2006.01) |
| *H01L 25/10* | (2006.01) |

(52) U.S. Cl.
CPC ........ *B81C 1/00904* (2013.01); *H01L 21/561* (2013.01); *H01L 23/5389* (2013.01); *H01L 23/552* (2013.01); *H01L 24/19* (2013.01); *H01L 24/96* (2013.01); *H01L 24/97* (2013.01); *H01L 25/105* (2013.01); *H01L 25/50* (2013.01); *B81B 2207/092* (2013.01); *B81B 2207/098* (2013.01); *B81C 2203/0792* (2013.01); *H01L 21/568* (2013.01); *H01L 24/16* (2013.01); *H01L 24/81* (2013.01); *H01L 2224/03* (2013.01); *H01L 2224/0401* (2013.01); *H01L 2224/04042* (2013.01); *H01L 2224/04105* (2013.01); *H01L 2224/12105* (2013.01); *H01L 2224/131* (2013.01); *H01L 2224/16227* (2013.01); *H01L 2224/16237* (2013.01); *H01L 2224/32145* (2013.01); *H01L 2224/32225* (2013.01); *H01L 2224/48091* (2013.01); *H01L 2224/48227* (2013.01); *H01L 2224/48235* (2013.01); *H01L 2224/73265* (2013.01); *H01L 2224/73267* (2013.01); *H01L 2224/81005* (2013.01); *H01L 2224/81191* (2013.01); *H01L 2224/81815* (2013.01); *H01L 2224/83* (2013.01); *H01L 2224/94* (2013.01); *H01L 2224/97* (2013.01); *H01L 2225/1035* (2013.01); *H01L 2225/1058* (2013.01); *H01L 2924/00012* (2013.01); *H01L 2924/13091* (2013.01); *H01L 2924/15* (2013.01); *H01L 2924/15311* (2013.01); *H01L 2924/16251* (2013.01); *H01L 2924/181* (2013.01); *H01L 2924/18162* (2013.01); *H01L 2924/3511* (2013.01)

(58) Field of Classification Search
CPC . H01L 23/5389; H01L 21/561; B81C 1/0023; B81C 1/00301
See application file for complete search history.

(56) References Cited

U.S. PATENT DOCUMENTS

| | | | |
|---|---|---|---|
| 6,674,159 B1* | 1/2004 | Peterson | H01L 27/14618 257/434 |
| 6,934,065 B2 | 8/2005 | Kinsman | |
| 7,825,520 B1 | 11/2010 | Longo et al. | |
| 7,952,196 B1 | 5/2011 | Iannotti et al. | |
| 7,989,269 B2 | 8/2011 | Do et al. | |
| 8,269,323 B2 | 9/2012 | Khan et al. | |
| 8,455,300 B2 | 6/2013 | Chi et al. | |
| 8,552,556 B1 | 10/2013 | Kim et al. | |
| 8,629,546 B1 | 1/2014 | Scanlan | |
| 9,527,723 B2 | 12/2016 | Lin et al. | |
| 9,985,005 B2 | 5/2018 | Meyer et al. | |
| 10,189,702 B2 | 1/2019 | Lin et al. | |
| 2005/0139967 A1 | 6/2005 | Eskridge et al. | |
| 2006/0220209 A1 | 10/2006 | Karnezos et al. | |
| 2006/0267178 A1 | 11/2006 | Metzger | |
| 2007/0222041 A1 | 9/2007 | Weng et al. | |
| 2008/0136002 A1 | 6/2008 | Yang | |
| 2008/0174008 A1 | 7/2008 | Yang et al. | |
| 2008/0265397 A1 | 10/2008 | Lin et al. | |
| 2008/0283942 A1 | 11/2008 | Huang et al. | |
| 2008/0290455 A1 | 11/2008 | Furukawa | |
| 2009/0039491 A1 | 2/2009 | Kim et al. | |
| 2009/0057864 A1 | 3/2009 | Choi et al. | |
| 2009/0146282 A1 | 6/2009 | Tay et al. | |
| 2010/0258946 A1* | 10/2010 | Uchiyama | H01L 23/49827 257/E23.174 |
| 2011/0031634 A1* | 2/2011 | Pagaila | H01L 24/96 257/777 |
| 2011/0241197 A1 | 10/2011 | Theuss | |
| 2011/0291283 A1* | 12/2011 | Chi | H01L 24/19 257/773 |
| 2012/0075821 A1 | 3/2012 | Pagaila | |
| 2012/0119312 A1 | 5/2012 | Kuisma | |
| 2013/0032905 A1 | 2/2013 | Lo et al. | |
| 2013/0069252 A1 | 3/2013 | Han et al. | |
| 2013/0221452 A1 | 8/2013 | Strothmann et al. | |
| 2013/0249101 A1 | 9/2013 | Lin et al. | |
| 2013/0249115 A1 | 9/2013 | Lin et al. | |
| 2014/0015131 A1 | 1/2014 | Meyer et al. | |
| 2014/0103527 A1 | 4/2014 | Marimuthu et al. | |
| 2014/0264831 A1 | 9/2014 | Meyer | |
| 2015/0069623 A1 | 3/2015 | Tsai et al. | |
| 2015/0108661 A1 | 4/2015 | Vincent | |
| 2015/0162220 A1 | 6/2015 | Chou et al. | |
| 2015/0183637 A1 | 7/2015 | Luan | |
| 2016/0190107 A1 | 6/2016 | Meyer et al. | |
| 2019/0341269 A1 | 11/2019 | Kim et al. | |

* cited by examiner

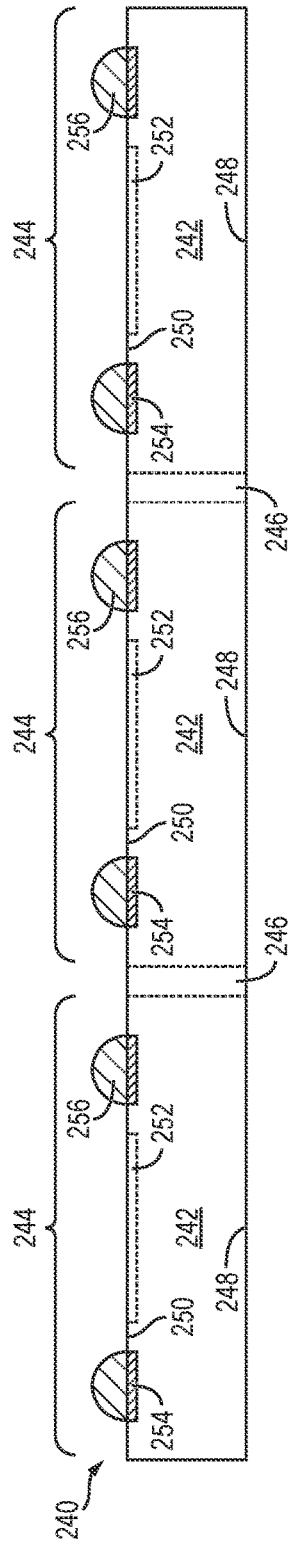
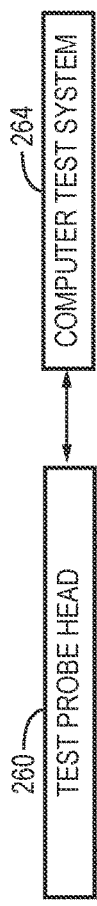
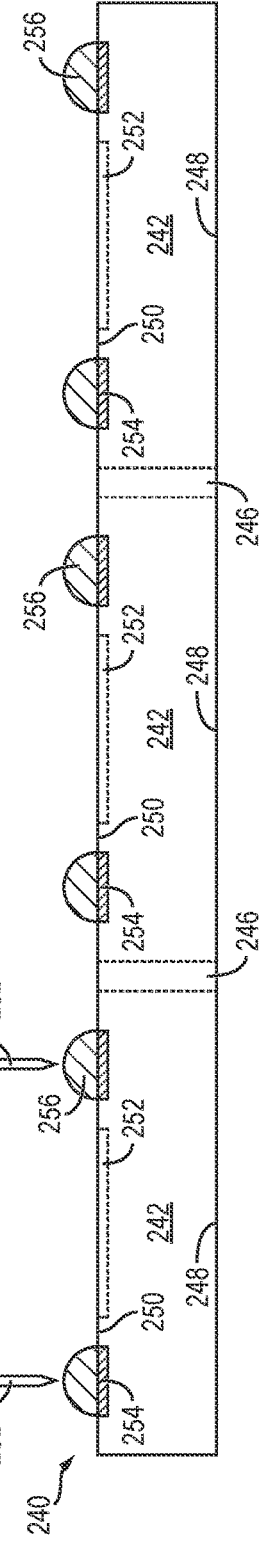
FIG. 5a
FIG. 5b
FIG. 5c

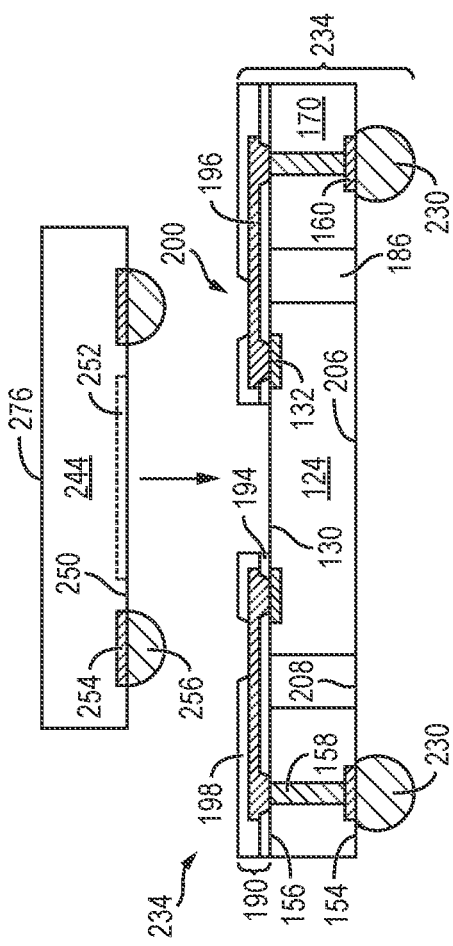
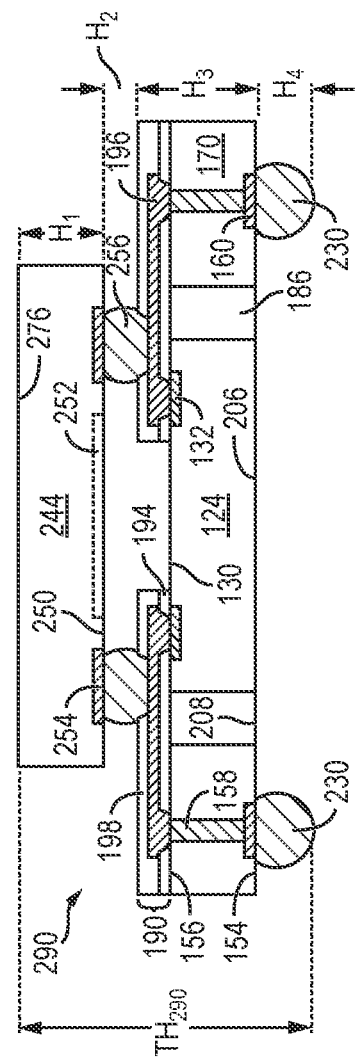
FIG. 6a
FIG. 6b

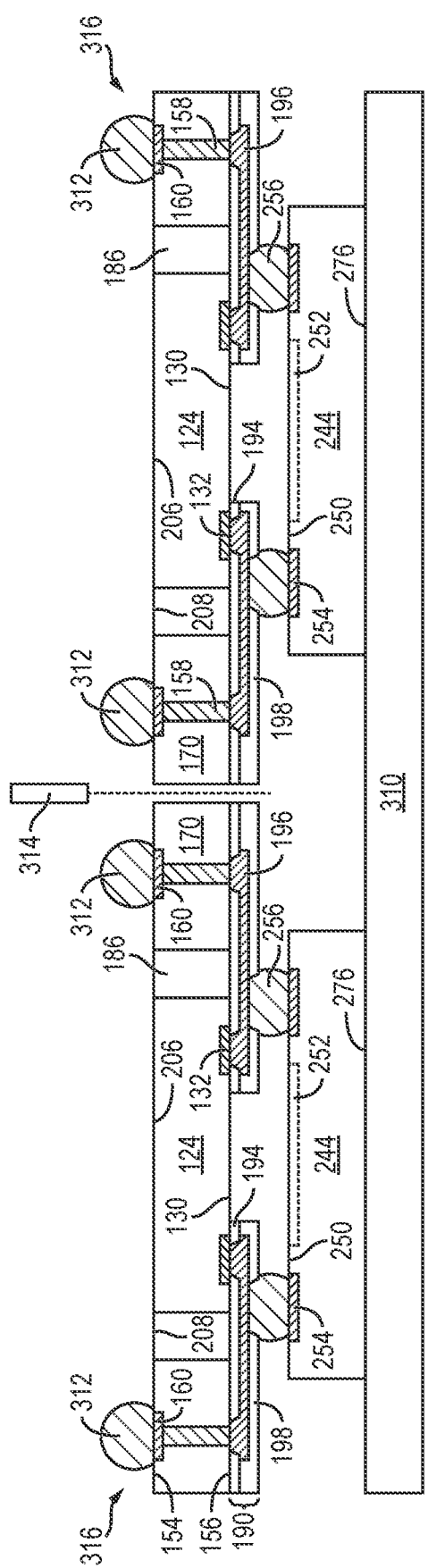
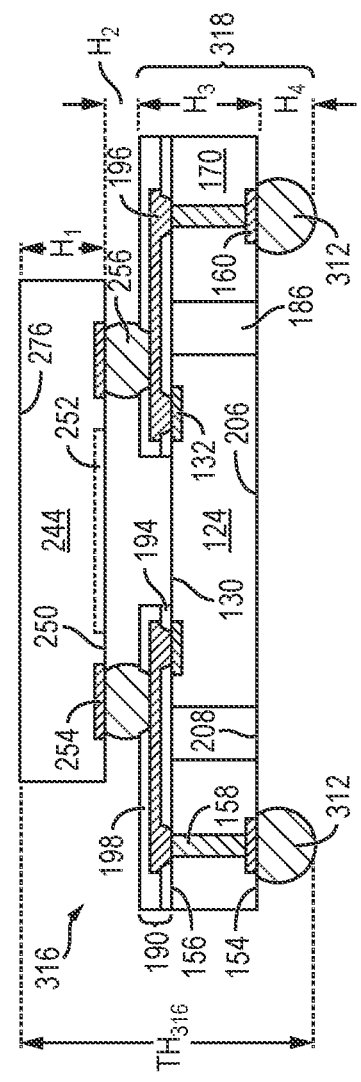
FIG. 7e
FIG. 7f

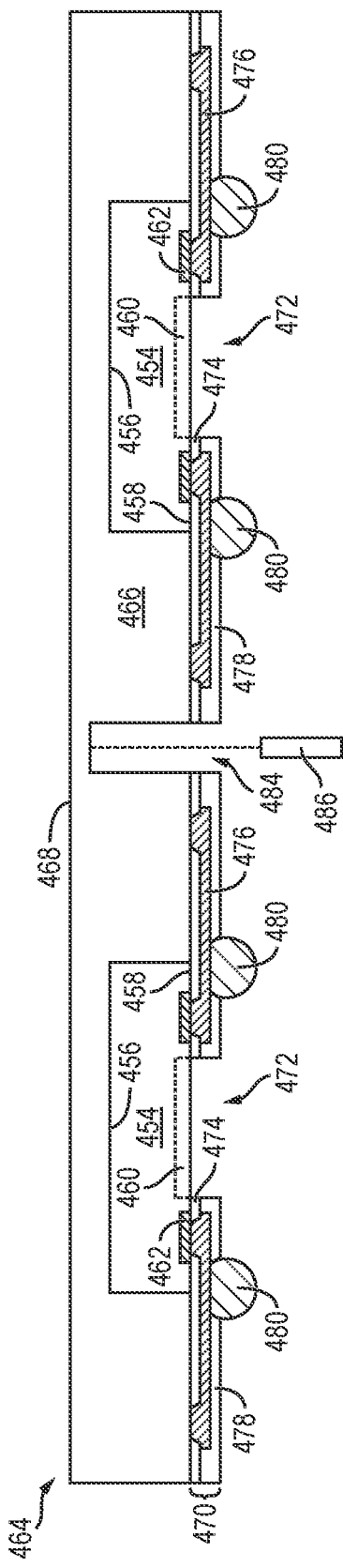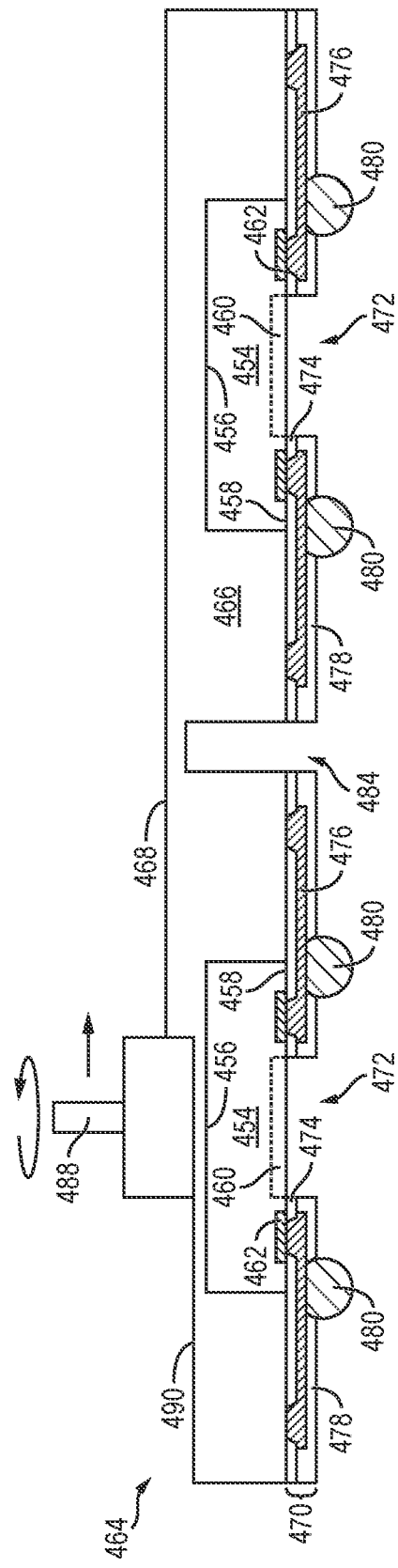

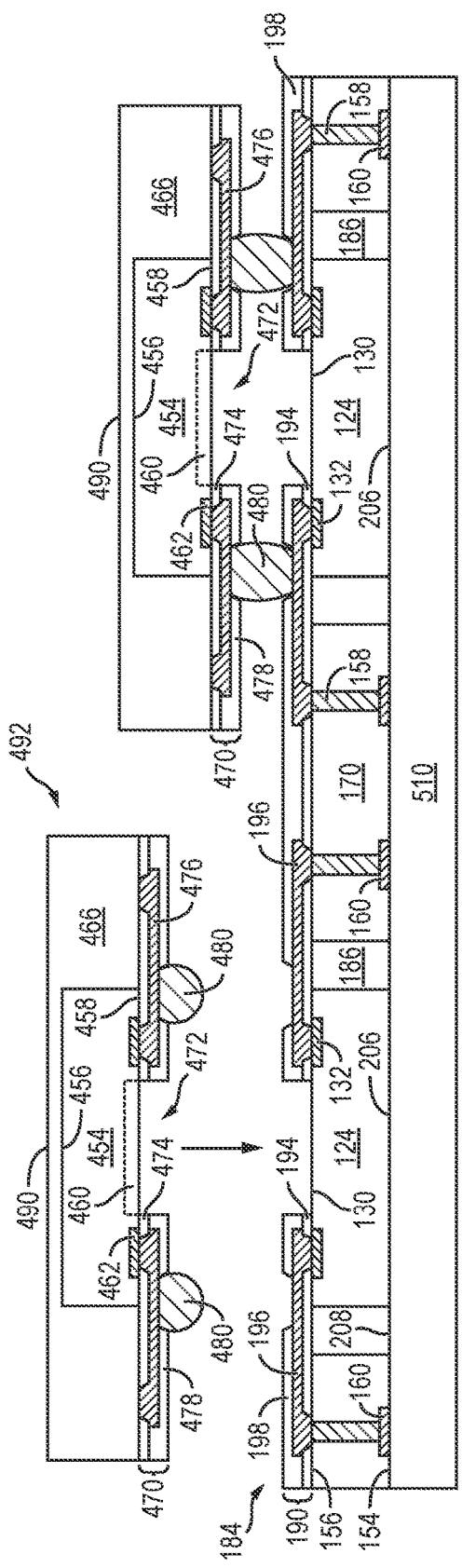
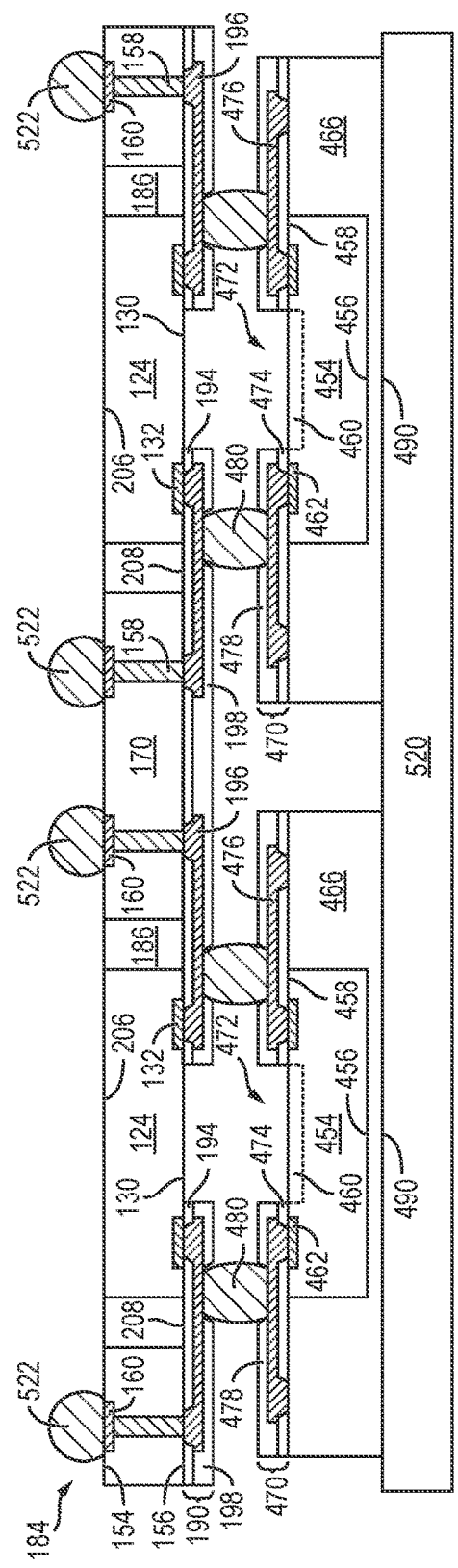

SEMICONDUCTOR DEVICE AND METHOD OF FORMING MICROELECTROMECHANICAL SYSTEMS (MEMS) PACKAGE

CLAIM OF DOMESTIC PRIORITY

The present application is a continuation of U.S. patent application Ser. No. 16/825,567, now U.S. Pat. No. 11,370,655, filed Mar. 20, 2020, which is a continuation of Ser. No. 16/169,817, now U.S. Pat. No. 10,662,056, filed Oct. 24, 2018, which is a continuation of U.S. patent application Ser. No. 15/362,199, now U.S. Pat. No. 10,189,702, filed Nov. 28, 2016, which application is a division of U.S. patent application Ser. No. 14/643,074, now U.S. Pat. No. 9,527,723, filed Mar. 10, 2015, which claims the benefit of U.S. Provisional Application No. 61/952,620, filed Mar. 13, 2014, all of which applications are incorporated herein by reference.

FIELD OF THE INVENTION

The present invention relates in general to semiconductor devices and, more particularly, to a semiconductor device and method of forming semiconductor packages for microelectromechanical systems (MEMS).

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, and various signal processing circuits.

Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The structure of semiconductor material allows the material's electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed operations and other useful functions.

Semiconductor devices are generally manufactured using two complex manufacturing processes, i.e., front-end manufacturing and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support, electrical interconnect, and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

One approach to achieving the objectives of greater integration and smaller semiconductor devices is to focus on three dimensional (3D) packaging technologies. The manufacturing of smaller semiconductor devices relies on implementing improvements to horizontal and vertical electrical interconnection between multiple semiconductor devices on multiple levels, i.e., 3D device integration. A reduced package profile is of particular importance for packaging in the cellular or smart phone industry. A substrate is used to integrate multiple semiconductor die by mounting a semiconductor die to a substrate. A top semiconductor die is mounted over a bottom semiconductor die. The substrate provides electrical interconnection between the semiconductor die and to external devices. However, a reduction in package height for current packages is constrained by the thickness of the substrate and interconnections. The substrate increases the package height and limits the achievable height reduction in packages with integrated stacked semiconductor die.

BRIEF DESCRIPTION OF THE DRAWINGS

FIGS. 5a-5f illustrate a semiconductor wafer with a plurality of semiconductor die separated by a saw street;

FIGS. 6a-6b illustrate a component-level assembly method of making a low-profile MEMS PoP device;

FIGS. 7a-7f illustrate a wafer-level assembly method of making a low-profile MEMS PoP device;

FIGS. 14a-14f illustrate a method of forming a MEMS eWLB top PoP device;

FIGS. 16a-16d illustrate a wafer-level assembly method of making a low-profile MEMS PoP device with a MEMS eWLB package stacked over a Fo-eWLB device.

DETAILED DESCRIPTION OF THE DRAWINGS

Figure 1:
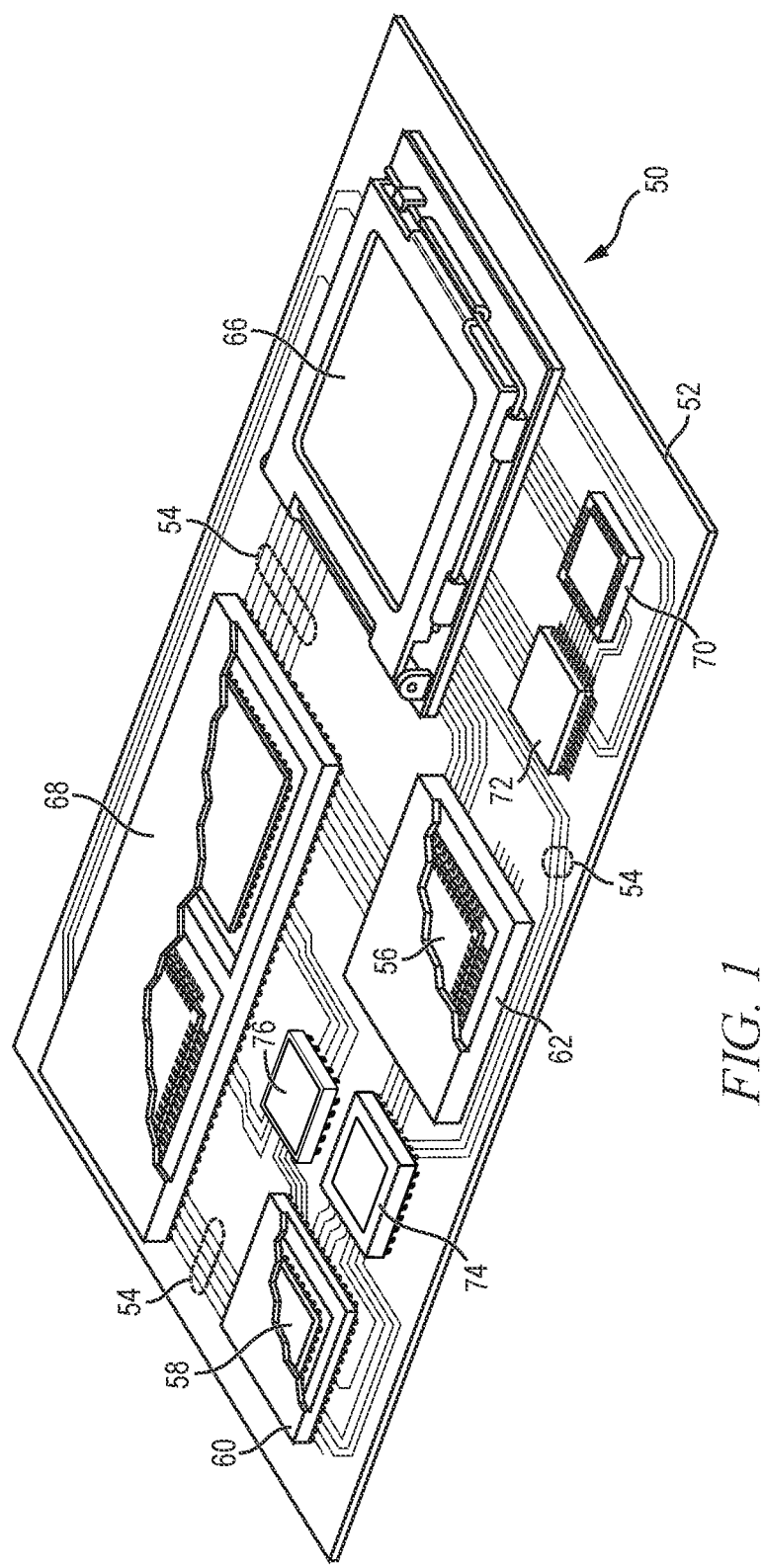
FIG. 1 illustrates a printed circuit board (PCB) with different types of packages mounted to a surface of the PCB.

The present invention is described in one or more embodiments in the following description with reference to the figures, in which like numerals represent the same or similar elements. While the invention is described in terms of the best mode for achieving objectives of the invention, those skilled in the art will appreciate that the disclosure is intended to cover alternatives, modifications, and equivalents as may be included within the spirit and scope of the invention as defined by the appended claims and claims equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices by dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or PCB 52 with a plurality of semiconductor packages mounted on a surface of PCB 52. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a tablet, cellular phone, digital camera, or other electronic device. Alternatively, electronic device 50 can be a graphics card, network interface card, or other signal processing card that can be inserted into a computer. The semiconductor package can include microprocessors, memories, application specific integrated circuits (ASIC), microelectromechanical systems (MEMS), logic circuits, analog circuits, radio frequency (RF) circuits, discrete devices, or other semiconductor die or electrical components. Miniaturization and weight reduction are essential for the products to be accepted by the market. The distance between semiconductor devices may be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, land grid array (LGA) 66, multi-chip module (MCM) 68, quad flat non-leaded package (QFN) 70, quad flat package 72, embedded wafer level ball grid array (eWLB) 74, and wafer level chip scale package (WLCSP) 76 are shown mounted on PCB 52. In one embodiment, eWLB 74 is a fan-out wafer level package (Fo-WLP) and WLCSP 76 is a fan-in wafer level package (Fi-WLP). Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
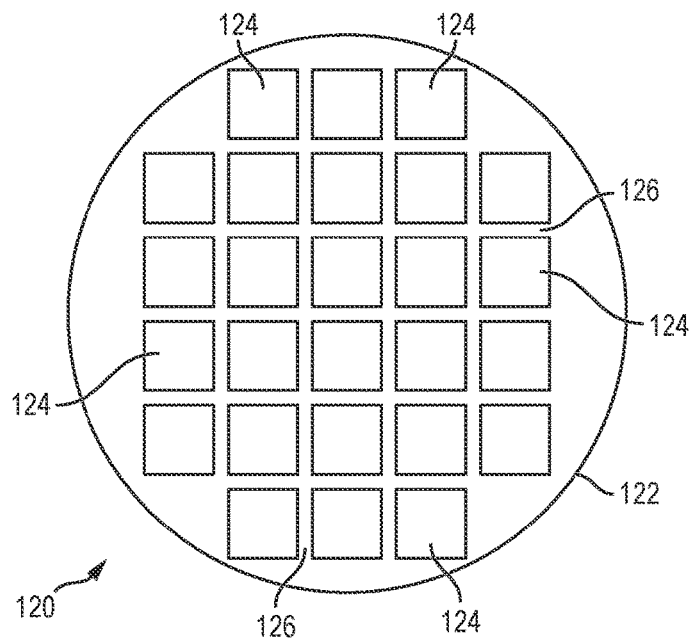
FIGS. 2a-2d illustrate a semiconductor wafer with a plurality of semiconductor die separated by a saw street.

FIG. 2a shows a semiconductor wafer 120 with a base substrate material 122, such as silicon, germanium, aluminum phosphide, aluminum arsenide, gallium arsenide, gallium nitride, indium phosphide, silicon carbide, or other bulk semiconductor material for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124. In one embodiment, semiconductor wafer 120 has a width or diameter of 100-450 millimeters (mm).

Figure 2B:
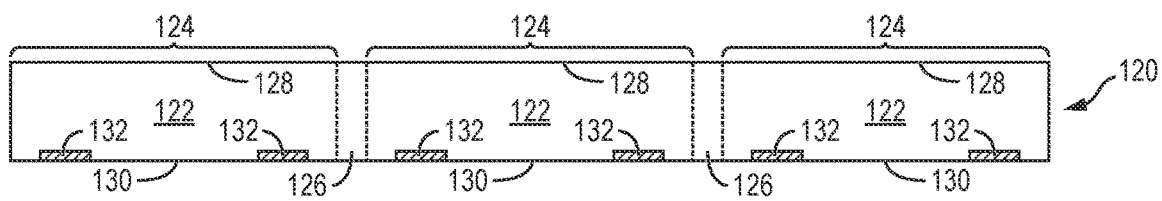

FIG. 2b shows a cross-sectional view of a portion of semiconductor wafer 120. Each semiconductor die 124 has a back or non-active surface 128 and an active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, MEMS, memory, or other signal processing circuit. In one embodiment, active surface 130 contains a MEMS, such as an accelerometer, gyroscope, strain gauge, microphone, or other sensor responsive to various external stimuli. Semiconductor die 124 may also contain integrated passive devices (IPDs), such as inductors, capacitors, and resistors, for RF signal processing.

An electrically conductive layer 132 is formed over active surface 130 using PVD, CVD, electrolytic plating, electroless plating process, or other suitable metal deposition process. Conductive layer 132 includes one or more layers of aluminum (Al), copper (Cu), tin (Sn), nickel (Ni), gold (Au), silver (Ag), or other suitable electrically conductive material or combination thereof. Conductive layer 132 operates as contact pads electrically connected to the circuits on active surface 130. Conductive layer 132 is formed as contact pads disposed side-by-side a first distance from the edge of semiconductor die 124, as shown in FIG. 2b. Alternatively, conductive layer 132 is formed as contact pads that are offset in multiple rows such that a first row of contact pads is disposed a first distance from the edge of the die, and a second row of contact pads alternating with the first row is disposed a second distance from the edge of the die. In one embodiment, back surface 128 of semiconductor wafer 120 undergoes an optional backgrinding operation with a grinder or other suitable mechanical or etching process to remove a portion of base material 122 and reduce the thickness of semiconductor wafer 120 including semiconductor die 124.

Semiconductor wafer 120 undergoes electrical testing and inspection as part of a quality control process. Manual visual inspection and automated optical systems are used to perform inspections on semiconductor wafer 120. Software can be used in the automated optical analysis of semiconductor wafer 120. Visual inspection methods may employ equipment such as a scanning electron microscope, high-intensity or ultra-violet light, or metallurgical microscope. Semiconductor wafer 120 is inspected for structural characteristics including warpage, thickness variation, surface particulates, irregularities, cracks, delamination, and discoloration.

Figure 2C:
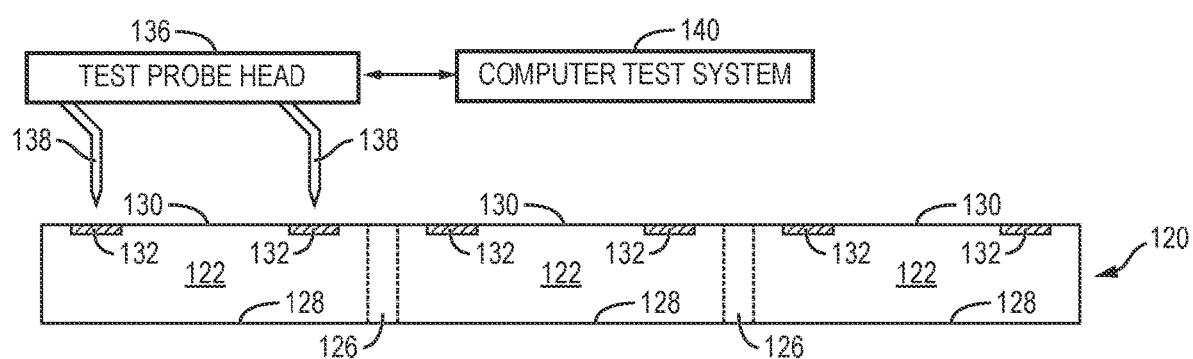

The active and passive components within semiconductor die 124 undergo testing at the wafer level for electrical performance and circuit function. Each semiconductor die 124 is tested for functionality and electrical parameters, as shown in FIG. 2c, using a test probe head 136 including a plurality of probes or test leads 138, or other testing device. Probes 138 are used to make electrical contact with nodes or conductive layer 132 on each semiconductor die 124 and provide electrical stimuli to the contact pads. Semiconductor die 124 responds to the electrical stimuli, which is measured by computer test system 140 and compared to an expected response to test functionality of the semiconductor die. The electrical tests may include circuit functionality, lead integrity, resistivity, continuity, reliability, junction depth, electro-static discharge (ESD), RF performance, drive current, threshold current, leakage current, and operational parameters specific to the component type. The inspection and electrical testing of semiconductor wafer 120 enables semiconductor die 124 that pass to be designated as known good die (KGD) for use in a semiconductor package.

Figure 2D:
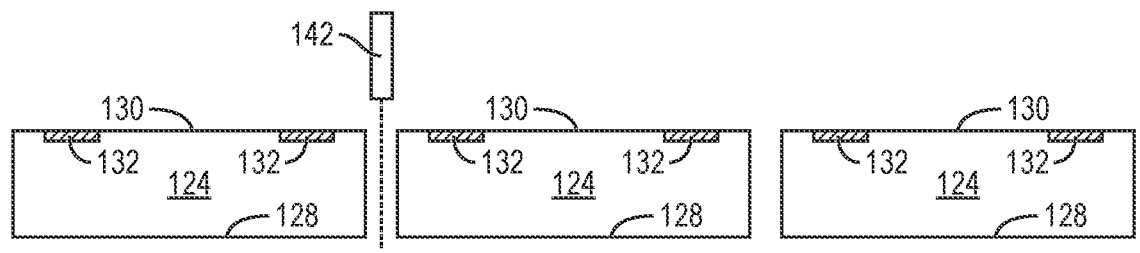

In FIG. 2d, semiconductor wafer 120 is singulated through saw street 126 using a saw blade or laser cutting tool 142 into individual semiconductor die 124. Individual semiconductor die 124 can be inspected and electrically tested for identification of KGD post singulation.

Figure 3A:
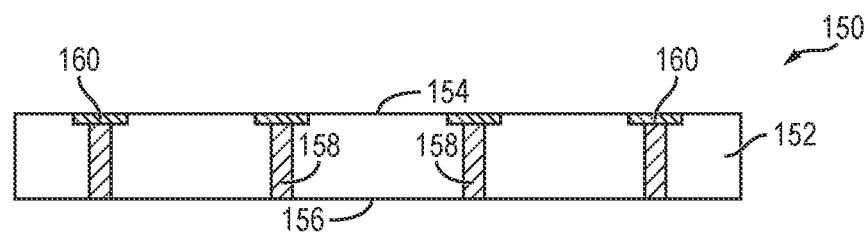
FIGS. 3a-3b illustrate a method of forming modular interconnect units with vertical interconnect structures.
Figure 3B:
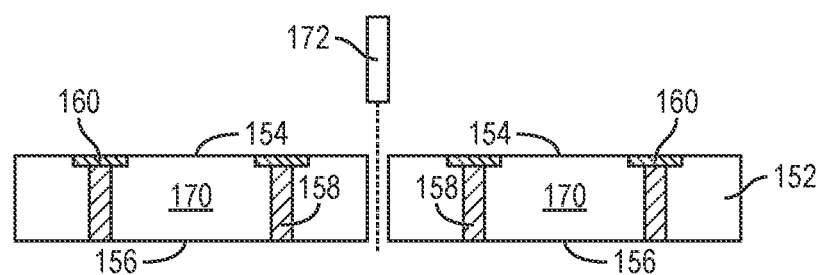

FIGS. 3a-3b illustrate, in relation to FIG. 1, a method of prefabricating modular interconnect units from a substrate panel. FIG. 3a shows a cross-sectional view of a portion of a substrate panel 150. Substrate panel 150 includes core substrate 152 having opposing surfaces 154 and 156. Core substrate 152 includes one or more laminated layers of polytetrafluoroethylene pre-impregnated (prepreg), FR-4, FR-1, CEM-1, or CEM-3 with a combination of phenolic cotton paper, epoxy, resin, woven glass, matte glass, polyester, and other reinforcement fibers or fabrics. Alternatively, core substrate 152 may include one or more insulating or passivation layers.

A plurality of through vias is formed through core substrate 152 using laser drilling, mechanical drilling, deep reactive ion etching (DRIE), or other suitable process. The through vias extend completely through core substrate 152 from surface 154 to surface 156. The through vias are filled with Al, Cu, Sn, Ni, Au, Ag, titanium (Ti), tungsten (W), or other suitable electrically conductive material or combination thereof using PVD, CVD, electrolytic plating, electroless plating process, or other suitable metal deposition process to form z-direction vertical interconnect structures or conductive vias 158. Alternatively, a conductive layer is formed over the sidewalls of the through vias using PVD, CVD, electrolytic plating, electroless plating process, or other suitable metal deposition process, and a center portion of the through vias is filled with a conductive filler material, e.g., Cu paste, or an insulating filler material, e.g., a polymer plug.

A conductive layer 160 is formed over surface 154 of core substrate 152 and over conductive vias 158 using PVD, CVD, electrolytic plating, electroless plating process, or other suitable metal deposition process. Conductive layer 160 includes one or more layers of Al, Cu, Sn, Ni, Au, Ag, or other suitable electrically conductive material or combination thereof. Portions of conductive layer 160 operate as contact pads and are electrically connected to conductive vias 158. Conductive layer 160 also includes portions that are electrically common or electrically isolated depending on the routing design and function of the semiconductor package. In another embodiment, conductive layer 160 operates as a redistribution layer (RDL) to extend electrical connection from conductive vias 158 to areas adjacent to conductive vias 158 to laterally redistribute electrical signals across substrate panel 150. Conductive layer 160 may be formed with traces or pads offset from conductive vias 158. In another embodiment, conductive layer 160 operates as a wire bondable pad or layer for subsequent electrical interconnection to conductive vias 158. A conductive layer similar to conductive layer 160 may be formed over surface 156 of core substrate 152 and over conductive vias 158. Alternatively, conductive vias 158 are formed through core substrate 152 after forming conductive layer 160.

In FIG. 3b, substrate panel 150 is singulated into individual modular interconnect structures or units 170 using saw blade or laser cutting tool 172. Modular interconnect units 170 are prefabricated from substrate panel 150 and are configured for integration into stacked semiconductor devices. In one embodiment, modular interconnect units 170 are formed without a solder resist layer over surfaces 154 and 156. Modular interconnect units 170 may include additional conductive layers or insulating layers formed over surfaces 154 and 156 to provide additional electrical interconnect across the unit according to the design and functionality of the device. In one embodiment, passive devices are formed over surface 154 or surface 156 of modular interconnect units 170. Conductive layer 160 as well as additional conductive and insulating layers may contain passive devices formed within the circuit layers. In another embodiment, a discrete component or passive device is mounted to modular interconnect units 170. Discrete components include filters, discrete passive devices such as inductors, resistors, or capacitors, or other devices.

Modular interconnect units 170 are prefabricated and provide a cost effective alternative for vertical interconnection in semiconductor packages. Modular interconnect units 170 are manufactured with lower cost materials and manufacturing technology. Use of modular interconnect units 170 for vertical interconnection decreases cycle time and increases manufacturing throughput. Modular interconnect units 170 also provide improved control over vertical interconnection. Thus, modular interconnect units 170 increase the design flexibility and improve the electrical performance and functionality of semiconductor packages, while decreasing cost and without increasing package thickness.

Figure 4A:
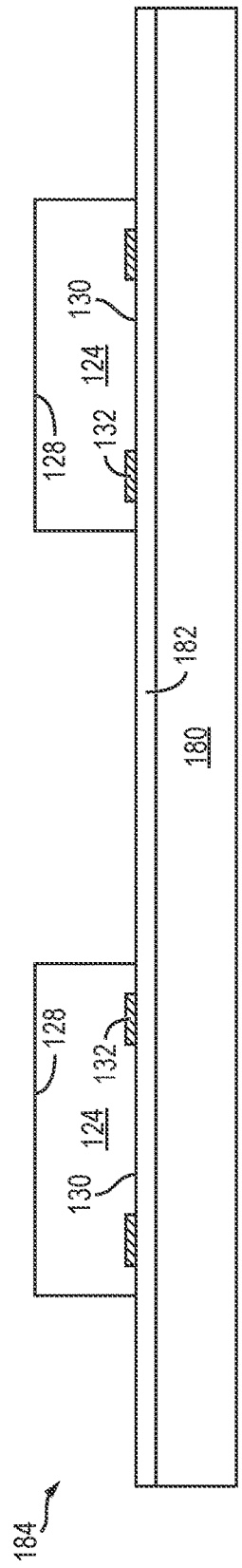
FIGS. 4a-4k illustrate a method of forming a bottom package-on-package (PoP) device for component-level assembly.

FIGS. 4a-4k illustrate, in relation to FIG. 1, a method of forming a bottom PoP device. FIG. 4a shows a cross-sectional view of a portion of a carrier or temporary substrate 180 containing sacrificial base material such as silicon, polymer, beryllium oxide, glass, or other suitable low-cost, rigid material for structural support. An interface layer or double-sided tape 182 is formed over carrier 180 as a temporary adhesive bonding film, etch-stop layer, or thermal release layer.

Carrier 180 can be a round or rectangular panel (greater than 300 mm) with capacity for multiple semiconductor die 124. Carrier 180 may have a larger surface area than the surface area of semiconductor wafer 120. A larger carrier reduces the manufacturing cost of the semiconductor package as more semiconductor die can be processed on the larger carrier thereby reducing the cost per unit. Semiconductor packaging and processing equipment is designed and configured for the size of the wafer or carrier being processed.

To further reduce manufacturing costs, the size of carrier 180 is selected independent of the size of semiconductor die 124 or size of semiconductor wafer 120. That is, carrier 180 has a fixed or standardized size, which can accommodate various size semiconductor die 124 singulated from one or more semiconductor wafers 120. In one embodiment, carrier 180 is circular with a diameter of 330 mm. In another embodiment, carrier 180 is rectangular with a width of 560 mm and length of 600 mm. Semiconductor die 124 may have dimensions of 10 mm by 10 mm, which are placed on the standardized carrier 180. Alternatively, semiconductor die 124 may have dimensions of 20 mm by 20 mm, which are placed on the same standardized carrier 180. Accordingly, standardized carrier 180 can handle any size semiconductor die 124, which allows subsequent semiconductor processing equipment to be standardized to a common carrier, i.e., independent of die size or incoming wafer size. Semiconductor packaging equipment can be designed and configured for a standard carrier using a common set of processing tools, equipment, and bill of materials to process any semiconductor die size from any incoming wafer size. The common or standardized carrier 180 lowers manufacturing costs and capital risk by reducing or eliminating the need for specialized semiconductor processing lines based on die size or incoming wafer size. By selecting a predetermined carrier size to use for any size semiconductor die from all semiconductor wafer sizes, a flexible manufacturing line can be implemented.

Semiconductor die 124 from FIG. 2d are mounted to interface layer 182 and over carrier 180 using, for example, a pick and place operation with active surface 130 oriented toward the carrier. FIG. 4a shows semiconductor die 124 mounted to interface layer 182 of carrier 180 as reconstituted panel or reconfigured wafer 184.

Reconstituted wafer or panel 184 can be processed into many types of semiconductor packages, including eWLB, fan-in WLCSP, eWLCSP, fan-out WLCSP, flipchip packages, 3D packages, PoP, or other semiconductor packages. Reconstituted panel 184 is configured according to the specifications of the resulting semiconductor package. In one embodiment, semiconductor die 124 are placed on carrier 180 in a high-density arrangement, i.e., 300 μm apart or less, for processing fan-in devices. The distance between semiconductor die 124 on carrier 180 is optimized for manufacturing the semiconductor packages at the lowest unit cost. The larger surface area of carrier 180 accommodates more semiconductor die 124 and lowers manufacturing cost as more semiconductor die 124 are processed per reconstituted panel 184. The number of semiconductor die 124 mounted to carrier 180 can be greater than the number of semiconductor die 124 singulated from semiconductor wafer 120. Carrier 180 and reconstituted panel 184 provide the flexibility to manufacture many different types of semiconductor packages using different size semiconductor die 124 from different sized semiconductor wafers 120.

Figure 4B:
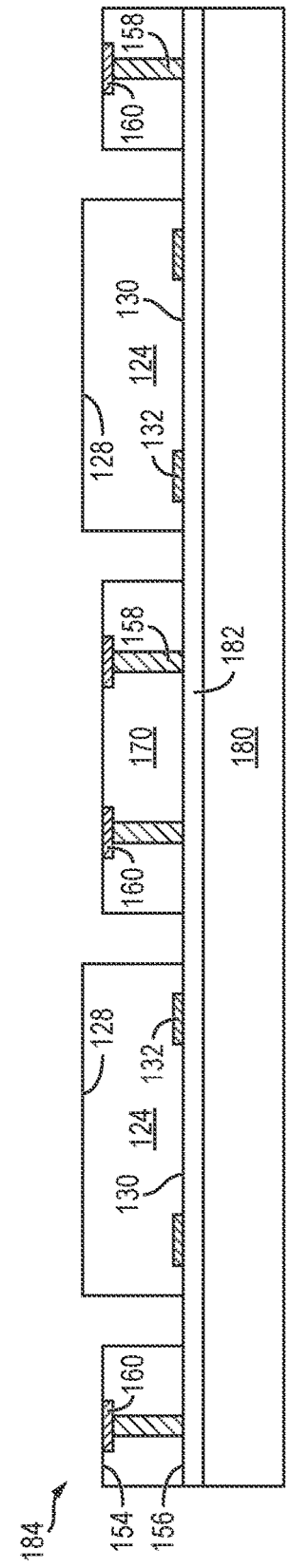

In FIG. 4b, modular interconnect units 170 are mounted over carrier 180 adjacent to semiconductor die 124 using, for example, a pick and place operation with an optional adhesive. Modular interconnect units 170 are disposed on interface layer 182 in a peripheral region of semiconductor die 124. Modular interconnect units 170 are disposed within the semiconductor package at specific predetermined locations around semiconductor die 124 to optimize the space within the semiconductor package. When mounting modular interconnect units 170 adjacent to semiconductor die 124, a gap or space may remain between semiconductor die 124 and modular interconnect units 170. Modular interconnect units 170 provide vertical interconnect and increase flexibility of semiconductor package design. Because modular interconnect units 170 are prefabricated, use of modular interconnect units 170 for vertical interconnections reduces the manufacturing steps for the semiconductor package.

Modular interconnect units 170 are disposed adjacent to one or more sides of semiconductor die 124. In one embodiment, modular interconnect units 170 are disposed along two, three, or four sides of each semiconductor die 124 on reconstituted panel 184. Modular interconnect units 170 contain multiple rows of conductive vias 158. Conductive layer 160 operates as contact pads or RDLs over conductive vias 158. Modular interconnect units 170 include square, rectangular, cross-shaped, angled or "L-shaped," or any geometrically-shaped footprint. Any number or configuration of modular interconnect units 170 are disposed adjacent to semiconductor die 124 depending on the routing design and function of the device.

Figure 4C:
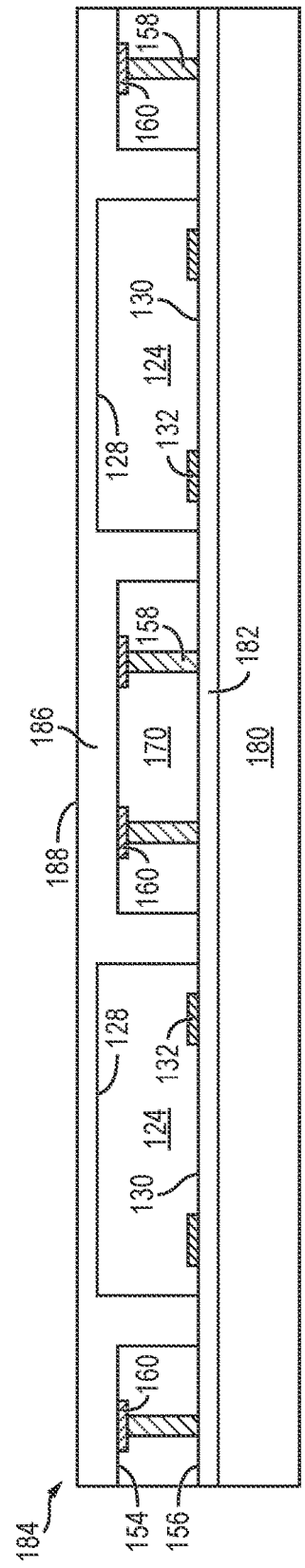

In FIG. 4c, an encapsulant or molding compound 186 is deposited over semiconductor die 124, modular interconnect units 170, and carrier 180 as an insulating material using a paste printing, compressive molding, transfer molding, liquid encapsulant molding, vacuum lamination, spin coating, or other suitable applicator. Encapsulant 186 includes polymer composite material, such as epoxy resin with filler, epoxy acrylate with filler, or polymer with proper filler. Encapsulant 186 is non-conductive and environmentally protects the semiconductor device from external elements and contaminants. Encapsulant 186 is deposited between semiconductor die 124 and modular interconnect units 170 to cover the side surfaces of semiconductor die 124. Encapsulant 186 includes surface 188 over back surface 128 of semiconductor die 124, and encapsulant 186 covers surface 154 of modular interconnect units 170.

Figure 4D:
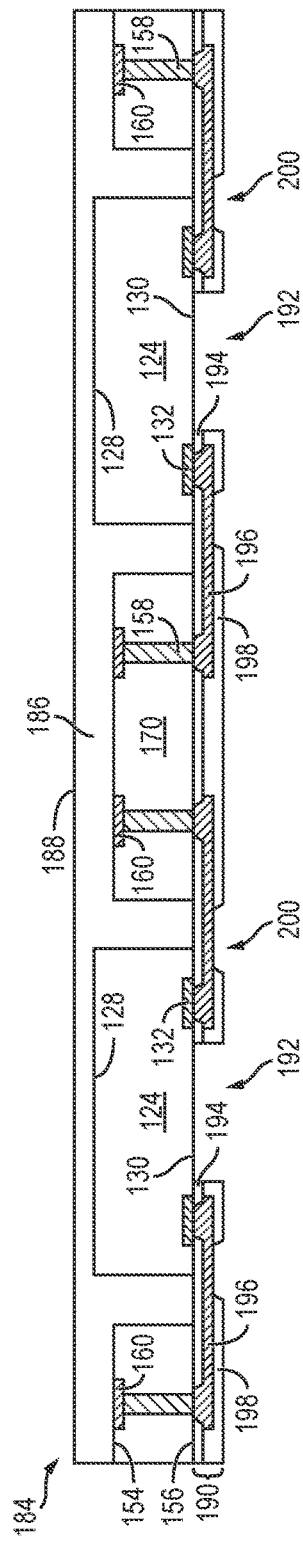

In FIG. 4d, temporary carrier 180 and optional interface layer 182 are removed by chemical etching, mechanical peel-off, chemical mechanical planarization (CMP), mechanical grinding, thermal bake, laser scanning, or wet stripping. Modular interconnect units 170 and active surface 130 of semiconductor die 124 are exposed after carrier 180 and interface layer 182 are removed.

A build-up interconnect structure 190 is formed over semiconductor die 124 and encapsulant 186, while an optional non-routing area 192 remains devoid of interconnect structure 190. In applications where semiconductor die 124 contains an active region, such as a MEMS, area 192 may be protected by a cap. In another embodiment, interconnect structure 190 is formed over active surface 130 of semiconductor die 124 including over area 192.

Interconnect structure 190 includes an insulating or passivation layer 194 containing one or more layers of silicon dioxide (SiO2), silicon nitride (Si3N4), silicon oxynitride (SiON), tantalum pentoxide (Ta2O5), aluminum oxide (Al2O3), low temperature curable polymer dielectric resist (i.e., cures at less than 250° C.), BCB, PBO, epoxy based photosensitive polymer dielectric, or other material having similar insulating and structural properties. Insulating layer 194 is formed over active surface 130 of semiconductor die 124, a surface of encapsulant 186, and surface 156 of modular interconnect units 170 using PVD, CVD, printing, spin coating, spray coating, sintering or thermal oxidation. A portion of insulating layer 194 is removed by laser direct ablation (LDA) or an etching process through a patterned photoresist layer to expose contact pads 132 of semiconductor die 124 and conductive vias 158 of modular interconnect units 170. In one embodiment, area 192 remains devoid of insulating layer 194.

An electrically conductive layer 196 is formed over insulating layer 194, contact pads 132, and conductive vias 158 using a patterning and metal deposition process such as PVD, CVD, sputtering, electrolytic plating, and electroless plating. Conductive layer 196 includes one or more layers of Al, Cu, Ti, TiW, tin Sn, Ni, Au, Ag, W, or other suitable electrically conductive material or combination thereof. Conductive layer 196 operates as an RDL to redistribute electrical connection from semiconductor die 124 to outside a footprint of semiconductor die 124. One portion of conductive layer 196 is electrically connected to contact pads 132 of semiconductor die 124. Other portions of conductive layer 196 are electrically common or electrically isolated depending on the design and function of the semiconductor device. Conductive layer 196 electrically connects contact pads 132 of semiconductor die 124 to conductive vias 158 of modular interconnect units 170. In one embodiment, area 192 remains devoid of conductive layer 196.

An insulating or passivation layer 198 is formed over insulating layer 194 and conductive layer 196 using PVD, CVD, printing, spin coating, spray coating, sintering or thermal oxidation. Insulating layer 198 includes one or more layers of SiO2, Si3N4, SiON, Ta2O5, Al2O3, low temperature curable polymer dielectric resist (i.e., cures at less than 250° C.), BCB, PBO, or epoxy based photosensitive polymer dielectric, or other material having similar insulating and structural properties. In one embodiment, area 192 remains devoid of insulating layer 198. A portion of insulating layer 198 is removed by LDA or an etching process through a patterned photoresist layer to form openings 200 to expose portions of conductive layer 196.

Figure 4E:
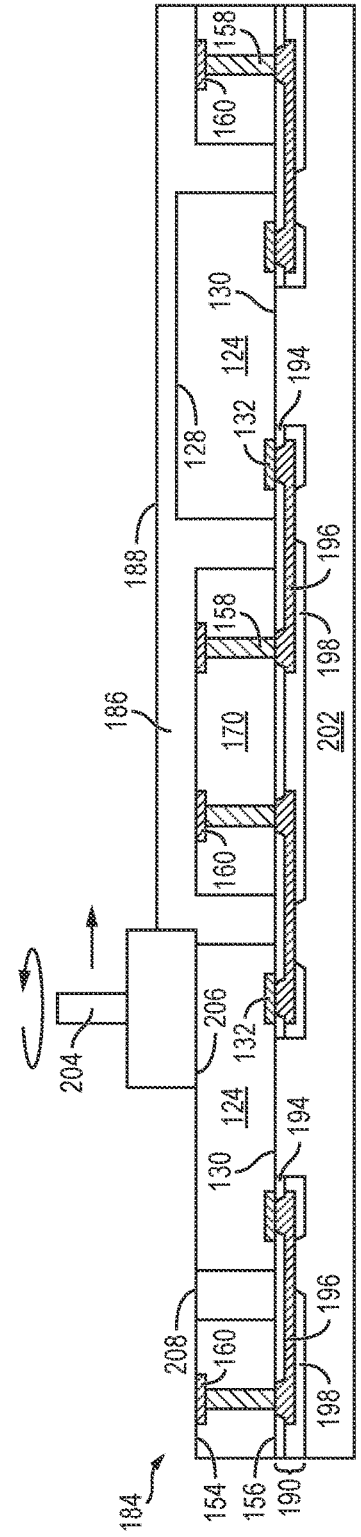

In FIG. 4e, an optional backgrinding tape or support tape 202 is applied over reconstituted panel 184 and in contact with interconnect structure 190. In another embodiment, support tape 202 includes a thermally resistant tape, warpage balancing tape, or other tape. For example, support tape 202 may include a material having high thermal conductivity and high heat resistance. Alternatively, reconstituted panel 184 is placed in a supporting jig with or without support tape 202. Reconstituted panel 184 undergoes a backgrinding operation with grinder 204 or other suitable mechanical or etching process to reduce a thickness of reconstituted panel 184 and to expose semiconductor die 124. The backgrinding operation removes a portion of encapsulant 186 from over semiconductor die 124 and modular interconnect units 170. In one embodiment, the backgrinding operation removes a portion of semiconductor die 124 as well as a portion of encapsulant 186 and leaves new back surface 206 of semiconductor die 124 coplanar with new surface 208 of encapsulant 186. The backgrinding operation removes encapsulant 186 from over surface 154 of modular interconnect units 170 to expose conductive layer 160 over conductive vias 158.

Figure 4F:
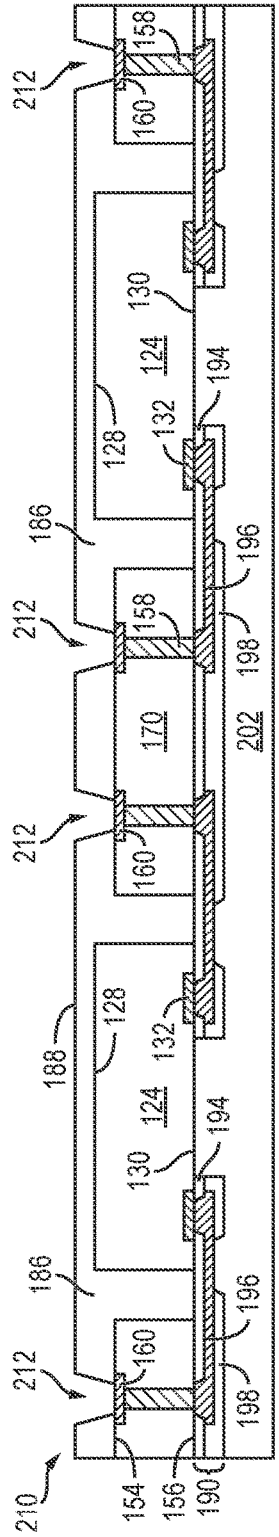

FIG. 4f shows an alternative reconstituted panel 210 with shallow drilling to expose modular interconnect units 170. A portion of encapsulant 186 is removed by LDA to form openings or vias 212 extending down to conductive layer 160 of modular interconnect units 170. In one embodiment, LDA is performed using an ultra violet (UV) laser, carbon dioxide (CO2) laser, or other suitable laser for selective LDA removal of encapsulant 186. Alternatively, openings 212 are formed by an etching process through a patterned photoresist layer, plasma etching, wet etching, high energy water jetting, or other suitable process. Openings 212 extend completely through a portion of encapsulant 186 over modular interconnect units 170. In one embodiment, openings 212 extend from surface 188 of encapsulant 186 to surface 154 of modular interconnect units 170. In another embodiment, openings 212 are formed with shallow drilling to expose conductive layer 160 over conductive vias 158. Openings 212 extend to conductive layer 160 and expose conductive layer 160 for subsequent electrical interconnection through encapsulant 186. Openings 212 have a footprint or cross-sectional area that is circular, oval, square, rectangular, or any other geometric shape. In one embodiment, openings 212 include sloped sidewalls forming a tapered shape with a larger diameter at the top of opening 212 and a smaller diameter at the bottom of opening 212. In another embodiment, openings 212 include vertical sidewalls. Openings 212 provide for subsequent electrical interconnect for stacked semiconductor devices to modular interconnect units 170. After openings 212 are formed, openings 212 may undergo a cleaning process or other treatment, such as an organic solderability preservative (OSP) process, plasma cleaning or wet etching, or a process to enhance a wire bondable surface.

Figure 4G:
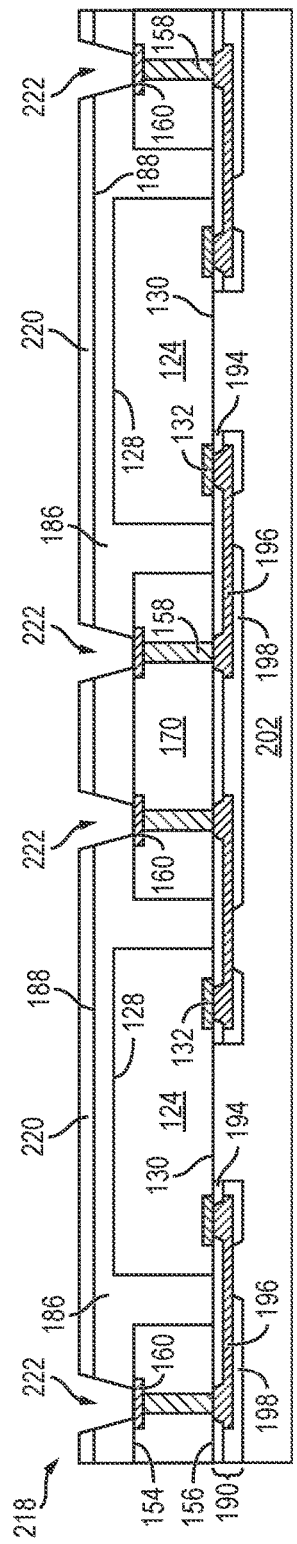

FIG. 4g shows another reconstituted panel 218 with drilling through a warpage balance layer to expose modular interconnect units 170. An optional backside warpage balance tape or balance layer 220 is applied over a back surface of reconstituted panel 218, for example, over surface 188 of encapsulant 186. Balance layer 220 is formed using PVD, CVD, printing, lamination, spin coating, spray coating, sintering, or thermal oxidation. Balance layer 220 can be one or more layers of photosensitive polymer dielectric film with or without fillers, non-photosensitive polymer dielectric film, epoxy, epoxy resin, polymeric materials, polymer composite material such as epoxy resin with filler, epoxy acrylate with filler, or polymer with proper filler, thermoset plastic laminate, or other material having similar insulating and structural properties. In one embodiment, balance layer 220 provides structural support and warpage tuning capability for reconstituted panel 218 to control overall warpage. Balance layer 220 can also operate as a heat sink to enhance thermal dissipation from semiconductor die 124. Balance layer 220 can be any layer with suitable thermal and structural properties, such as resin coated copper (RCC) tape.

A plurality of openings 222 are formed through balance layer 220 and encapsulant 186 by LDA or other drilling process to expose conductive layer 160 of modular interconnect units 170. Openings 222 extend completely through balance layer 220 and through a portion of encapsulant 186 over modular interconnect units 170. Openings 222 extend to conductive layer 160 and expose conductive layer 160 for subsequent electrical interconnection through encapsulant 186. Openings 222 have a footprint or cross-sectional area that is circular, oval, square, rectangular, or any other geometric shape. In one embodiment, openings 222 include sloped sidewalls forming a tapered shape with a larger diameter at the top of opening 222 and a smaller diameter at the bottom of opening 222. In another embodiment, openings 222 include vertical sidewalls. Openings 222 provide for subsequent electrical interconnect for stacked semiconductor devices to modular interconnect units 170. After openings 222 are formed, openings 222 may undergo a cleaning process or other treatment, such as an OSP process, plasma cleaning or wet etching, or a process to enhance a wire bondable surface.

Figure 4H:
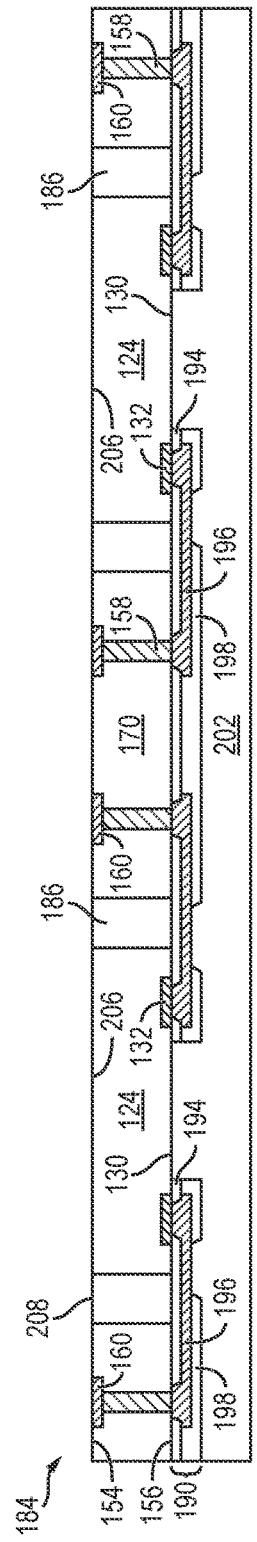

FIG. 4h continues from FIG. 4e and shows reconstituted panel 184 after the backgrinding operation shown in FIG. 4e. In FIG. 4h, encapsulant 186 is completely removed from over semiconductor die 124 and modular interconnect units 170. Conductive layer 160 over conductive vias 158 is exposed for subsequent interconnection.

Figure 4I:
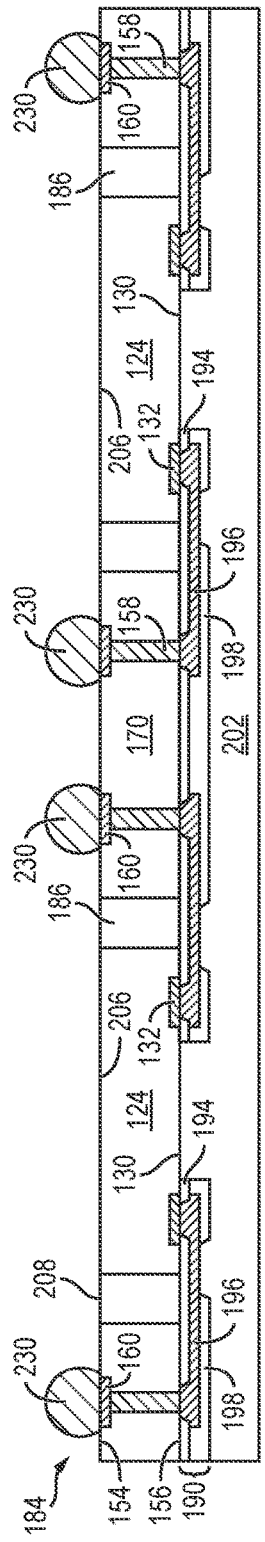

In FIG. 4i, an electrically conductive bump material is deposited over modular interconnect units 170 and electrically connected to conductive layer 160 using an evaporation, electrolytic plating, electroless plating, ball drop, or screen printing process. The bump material includes Al, Sn, Ni, Au, Ag, lead (Pb), bismuth (Bi), Cu, solder, or combinations thereof, with an optional flux solution. For example, the bump material can be eutectic Sn/Pb, high-lead solder, or lead-free solder. The bump material is bonded to conductive layer 160 using a suitable attachment or bonding process. In one embodiment, the bump material is reflowed by heating the material above its melting point to form spherical balls or bumps 230. In some applications, bumps 230 are reflowed a second time to improve electrical contact to conductive layer 160. The bumps can also be compression bonded to conductive layer 160. Bumps 230 represent one type of interconnect structure that is formed over conductive layer 160. The interconnect structure can also use bond wires, stud bump, micro bump, or other electrical interconnect. Bumps 230 or other interconnect structures are optional, and in one embodiment, are formed after singulation of reconstituted panel 184.

Figure 4J:
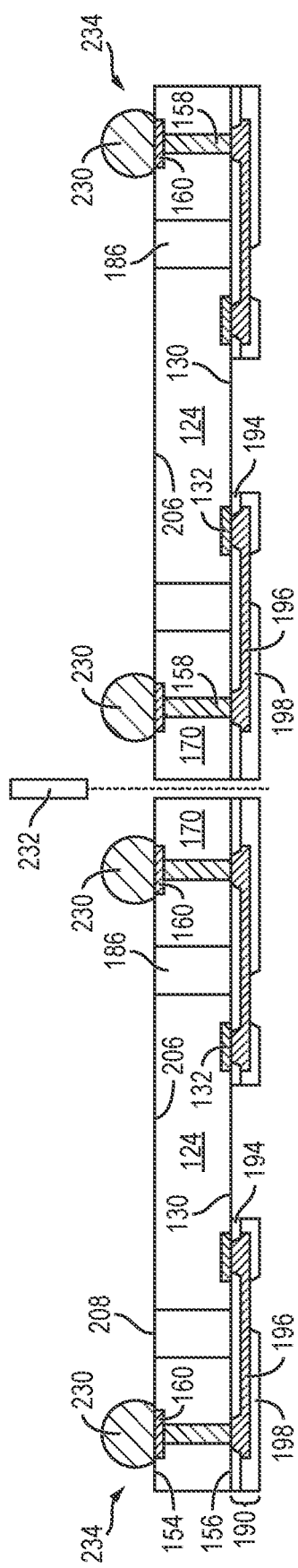

In FIG. 4j, reconstituted panel 184 is singulated with saw blade or laser cutting device 232 through modular interconnect units 170 and interconnect structure 190 into individual bottom PoP 234.

Figure 4K:
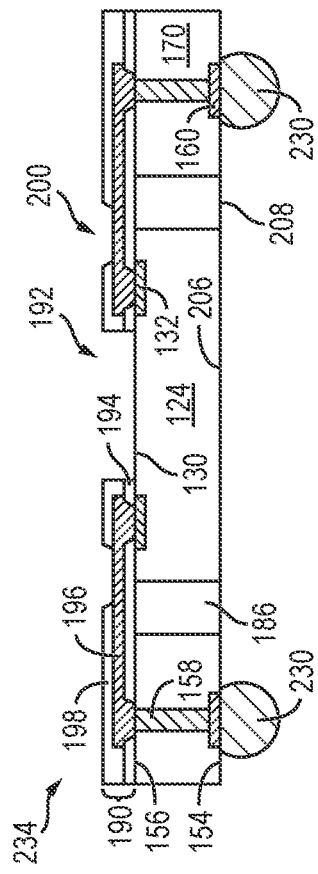

FIG. 4k shows a bottom PoP 234 after singulation. Bottom PoP 234 constitutes a Fo-eWLB device. Encapsulant 186 is disposed around semiconductor die 124 and modular interconnect units 170. Interconnect structure 190 includes insulating layers 194 and 198 and conductive layer 196 and is formed over active surface 130 of semiconductor die 124. Interconnect structure 190 may include fewer or additional conductive and insulating layers. Interconnect structure 190 includes an optional non-routing area 192. In one embodiment, semiconductor die 124 includes a MEMS. In another embodiment, semiconductor die 124 includes an ASIC. Semiconductor die 124 is electrically connected through conductive layer 196 to conductive vias 158 of modular interconnect units 170 for external interconnect through bumps 230.

Figure 5D:
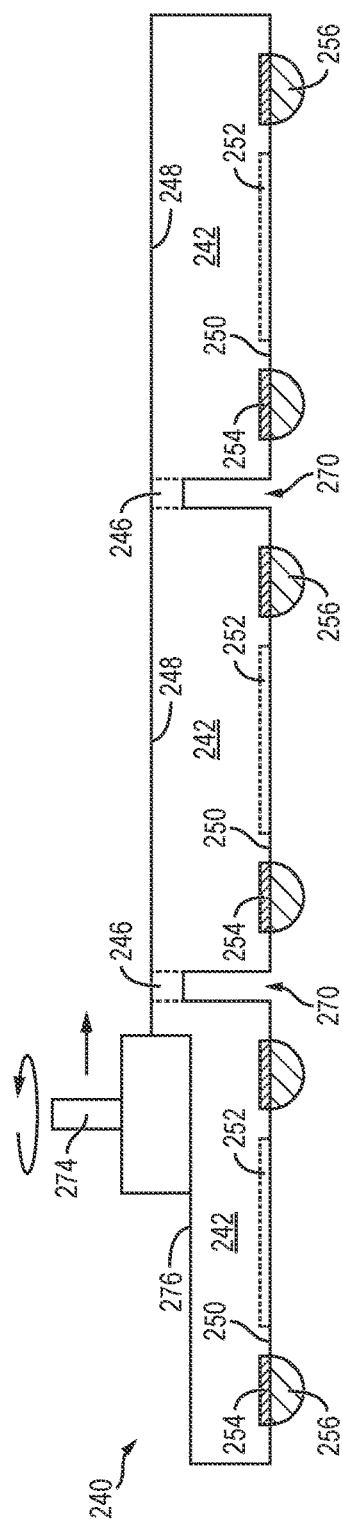

FIGS. 5a-5f show an alternative method of processing a semiconductor die. FIG. 5a shows a cross-sectional view of a portion of semiconductor wafer 240 with a base substrate material 242, such as silicon, germanium, aluminum phosphide, aluminum arsenide, gallium arsenide, gallium nitride, indium phosphide, silicon carbide, or other bulk semiconductor material for structural support. A plurality of semiconductor die or components 244 is formed on wafer 240 separated by a non-active, inter-die wafer area or saw street 246 as described above. Saw street 246 provides cutting areas to singulate semiconductor wafer 240 into individual semiconductor die 244. In one embodiment, semiconductor wafer 240 has a width or diameter of 100-450 mm.

Each semiconductor die 244 has a back or non-active surface 248 and an active surface 250 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 250 to implement analog circuits or digital circuits, such as DSP, ASIC, MEMS, memory, or other signal processing circuit. In one embodiment, active surface 250 contains an active region 252 including a MEMS or other active or passive sensors responsive to various external stimuli. An active sensor, such as a photodiode, a phototransistor, or a Hall effect device, generates or controls the flow of electrical current in response to an external stimulus. A passive sensor, such as a photoresistor, thermistor, capacitive accelerometer, or load cell, alters the relationship between voltage and current in response to the external stimulus. The external stimulus can be light, sound, electromagnetic radiation, electric field, magnetic field, ionizing radiation, vibration, motion, acceleration, rotation, orientation, pressure, or temperature. Active region 252 may include piezoelectric and nanoelectronic devices. Active region 252 is electrically connected to other analog and digital circuits on active surface 250 of semiconductor die 244 to perform functions in response to the external stimulus. An optional cover or cap, not shown, is disposed over active region 252 of semiconductor die 240 to protect active region 252.

An electrically conductive layer 254 is formed over active surface 250 using PVD, CVD, electrolytic plating, electroless plating process, or other suitable metal deposition process. Conductive layer 254 includes one or more layers of Al, Cu, Sn, Ni, Au, Ag, or other suitable electrically conductive material or combination thereof. Conductive layer 254 operates as contact pads electrically connected to the circuits on active surface 250. Conductive layer 254 is formed as contact pads disposed side-by-side a first distance from the edge of semiconductor die 244, as shown in FIG. 5a. Alternatively, conductive layer 254 is formed as contact pads that are offset in multiple rows such that a first row of contact pads is disposed a first distance from the edge of the die, and a second row of contact pads alternating with the first row is disposed a second distance from the edge of the die.

An electrically conductive bump material is deposited over conductive layer 254 using an evaporation, electrolytic plating, electroless plating, ball drop, or screen printing process. The bump material includes Al, Sn, Ni, Au, Ag, Pb, Bi, Cu, solder, or combinations thereof, with an optional flux solution. For example, the bump material can be eutectic Sn/Pb, high-lead solder, or lead-free solder. The bump material is bonded to conductive layer 254 using a suitable attachment or bonding process. In one embodiment, the bump material is reflowed by heating the material above its melting point to form spherical or dome-shaped balls or bumps 256. In some applications, bumps 256 are reflowed a second time to improve electrical contact to conductive layer 254. The bumps can also be compression bonded to conductive layer 254. Bumps 256 represent one type of interconnect structure that is formed over conductive layer 254. The interconnect structure can also use bond wires, stud bump, micro bump, or other electrical interconnect. In one embodiment, bumps 256 are formed with a dome-shape and a reduced height compared to spherical ball-shaped bumps in order to improve subsequent pick and place handling of individual semiconductor die 244. In another embodiment, bumps 256 are optional and semiconductor wafer 240 undergoes subsequent processing steps without bumping.

In FIG. 5b, semiconductor wafer 240 undergoes electrical testing and inspection as part of a quality control process. Manual visual inspection and automated optical systems are used to perform inspections on semiconductor wafer 240. Software can be used in the automated optical analysis of semiconductor wafer 240. Visual inspection methods may employ equipment such as a scanning electron microscope, high-intensity or ultra-violet light, or metallurgical microscope. Semiconductor wafer 240 is inspected for structural characteristics including warpage, thickness variation, surface particulates, irregularities, cracks, delamination, and discoloration.

The active and passive components within semiconductor die 244 undergo testing at the wafer level for electrical performance and circuit function. Each semiconductor die 244 is tested for functionality and electrical parameters, as shown in FIG. 5b, using a test probe head 260 including a plurality of probes or test leads 262, or other testing device. Probes 262 are used to make electrical contact with nodes or conductive layer 254 on each semiconductor die 244 and provide electrical stimuli to the contact pads. Semiconductor die 244 responds to the electrical stimuli, which is measured by computer test system 264 and compared to an expected response to test functionality of the semiconductor die. The electrical tests may include circuit functionality, lead integrity, resistivity, continuity, reliability, junction depth, ESD, RF performance, drive current, threshold current, leakage current, and operational parameters specific to the component type. The inspection and electrical testing of semiconductor wafer 240 enables semiconductor die 244 that pass to be designated as KGD for use in a semiconductor package.

In FIG. 5c, a groove or channel 270 is cut into base substrate material 242 within saw streets 246 using saw blade or laser cutting tool 272. Grooves 270 extend around a peripheral region of semiconductor die 244. The width of grooves 270 is similar to the width of saw streets 246. Grooves 270 are formed with a depth greater than or equal to the final selected height of semiconductor die 244. In one embodiment, grooves 270 have a depth of approximately 115 micrometers (μm) greater than the final height of semiconductor die 244. The final height of semiconductor die 244 is formed during a subsequent backgrinding operation. In another embodiment, grooves 270 are formed partially through base substrate material 242 and have a depth of approximately 530 μm. After grooves 270 are formed, a portion of base substrate material 242 remains in saw streets 246 connecting semiconductor die 244 within semiconductor wafer 240.

In FIG. 5d, back surface 248 of semiconductor wafer 240 undergoes a backgrinding operation with grinder 274 or other suitable mechanical or etching process to remove a portion of base material 242 and reduce the thickness of semiconductor wafer 240 including semiconductor die 244. The removal of base material 242 leaves new back surface 276 of semiconductor wafer 240. The backgrinding operation removes the remaining base material 242 in saw streets 246 to separate the individual semiconductor die 244. In one embodiment, a height of semiconductor die 244 after backgrinding is approximately 415 µm.

Figure 5E:
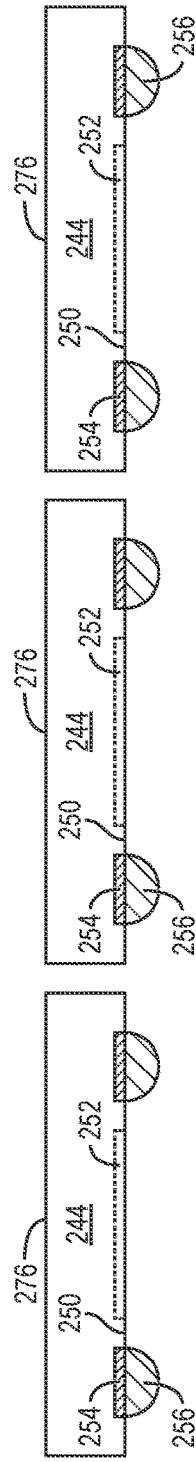

FIG. 5e shows semiconductor die 244 after the backgrinding operation. The backgrinding operation singulates semiconductor die 244 without using a dicing operation. Individual semiconductor die 244 can be inspected and electrically tested for identification of KGD post singulation.

Figure 5F:
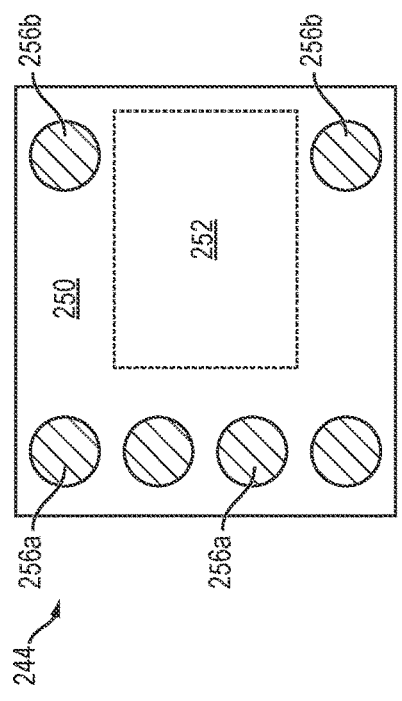

FIG. 5f shows a plan view of active surface 250 of semiconductor die 244. Semiconductor die 244 includes various configurations of bumps 256 according to the design and function of the die, and bumps 256 may include active bumps 256a and dummy or support bumps 256b. Active surface 250 of semiconductor die 244 is electrically connected to active bumps 256a. Dummy bumps 256b provide structural support and increase the mechanical bonding strength of semiconductor die 244 to other devices. In one embodiment, bumps 256 are formed along the edges of semiconductor die 244 while active region 252 remains devoid of bumps 256. The configuration of bumps 256 shown in FIG. 5f illustrates active bumps 256a disposed along a first edge of semiconductor die 244 and dummy bumps 256b disposed along a second edge opposite the first edge. In one embodiment, dummy bumps 256b are formed in one or more corners of semiconductor die 244 and active bumps 256a are formed along an edge opposite to dummy bumps 256b.

FIGS. 6a-6b show, in relation to FIGS. 1, 2a-2d, 3a-3b, 4a-4k, and 5a-5f, a method of forming a stacked MEMS package with a top package as a flip-chip MEMS semiconductor die. In FIG. 6a, a semiconductor die 244 from FIG. 5e is positioned over bottom PoP 234 from FIG. 4k. Semiconductor die 244 is mounted to interconnect structure 190. Bumps 256 on semiconductor die 244 are positioned over openings 200 in insulating layer 198 and contact conductive layer 196. In another embodiment, bumps are pre-formed over conductive layer 196 within openings 200 on bottom PoP 234, and semiconductor die 244 without bumps is mounted over bottom PoP 234.

FIG. 6b shows semiconductor die 244 as a top PoP device mounted to bottom PoP 234 as a stacked PoP device 290. Bumps 256 are reflowed to metallurgically and electrically connect to conductive layer 196. Alternatively, where bumps are pre-formed over interconnect structure 190, bumps 256 are subsequently reflowed to metallurgically and electrically connect to conductive layer 254 of semiconductor die 244. Semiconductor die 244 electrically connects to semiconductor die 124 and modular interconnect units 170 through conductive layer 196. Semiconductor die 124 and 244 electrically connect to external devices through interconnect structure 190, modular interconnect units 170, and bumps 230. Modular interconnect units 170 provide electrical routing and reduce the amount of additional RDL formed over bottom PoP 234. Additionally, bottom PoP 234 is formed using a reconstituted panel on a standardized carrier. Therefore, bottom PoP 234 is manufactured using standardized processing tools, equipment, and bill of materials, thereby reducing the cost of manufacturing PoP device 290.

PoP device 290 operates as a MEMS package with integrated MEMS and ASIC semiconductor die. In one embodiment, semiconductor die 124 includes an ASIC and semiconductor die 244 includes a MEMS or other active or passive sensors responsive to various external stimuli. In another embodiment, semiconductor die 244 includes an ASIC and semiconductor die 124 includes a MEMS. In one embodiment, semiconductor die 244 includes a height $H_1$ of approximately 415 µm and bumps 256 include a standoff height $H_2$ of approximately 60 µm. Bottom PoP 234 with semiconductor die 124, modular interconnect units 170, and interconnect structure 190 includes a height $H_3$ of approximately 175 µm and bumps 230 include a standoff height $H_4$ of approximately 110 µm. In one embodiment, a total height $TH_{290}$ of PoP device 290 is approximately 760 µm. Accordingly, PoP device 290 is formed with a reduced height for a lower profile MEMS package.

Figure 7A:
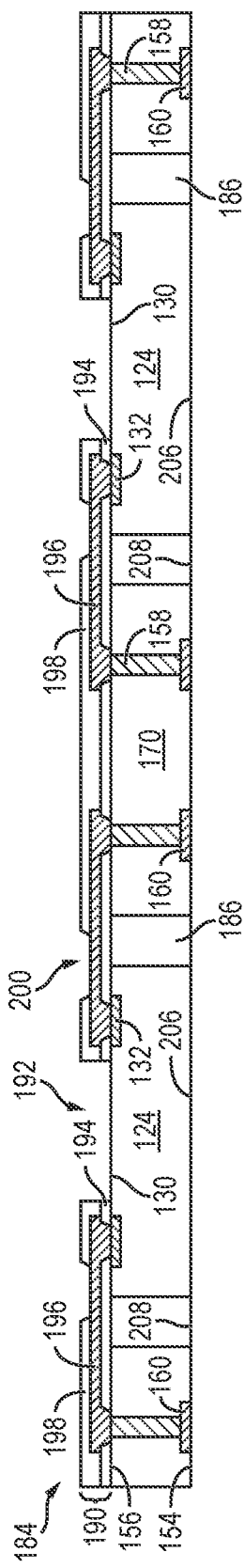
Figure 7B:
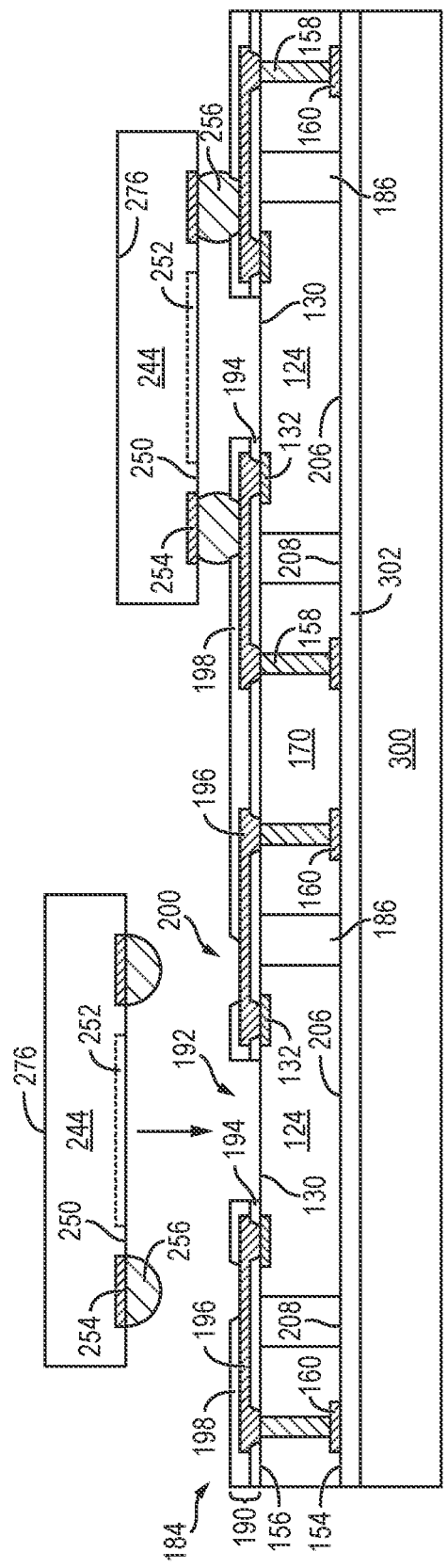

FIGS. 7a-7f show, in relation to FIGS. 1, 2a-2d, 3a-3b, 4a-4e, and 5a-5f, an alternative method of forming a stacked PoP device. Continuing from FIG. 4e, FIG. 7a shows support tape 202 removed from over reconstituted panel 184. In FIG. 7b, reconstituted panel 184 is disposed over and temporarily bonded to carrier or jig 300 with or without a supporting tape 302. In one embodiment, carrier 300 includes a temporary substrate containing sacrificial base material such as silicon, polymer, beryllium oxide, glass, or other suitable low-cost, rigid material for structural support. Supporting tape 302 includes an interface layer or double-sided tape and is formed over carrier 300 as a temporary adhesive bonding film, etch-stop layer, or thermal release layer.

Semiconductor die 244 from FIG. 5f are positioned over reconstituted panel 184 and mounted to interconnect structure 190. Bumps 256 are positioned over openings 200 in insulating layer 198 and contact conductive layer 196. In another embodiment, bumps are pre-formed over conductive layer 196 within openings 200 on reconstituted panel 184, and semiconductor die 244 without bumps is mounted over reconstituted panel 184.

Figure 7C:
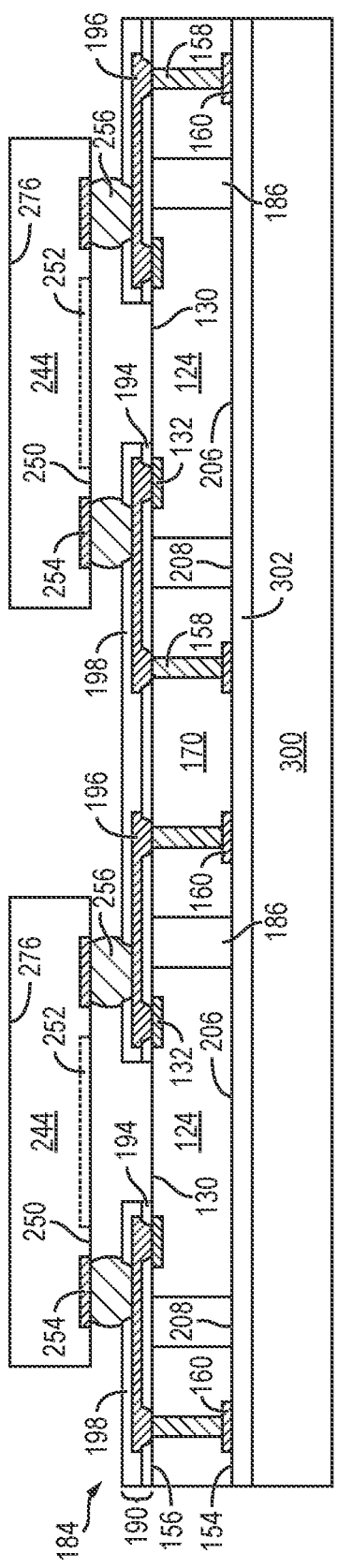

In FIG. 7c, bumps 256 are reflowed to metallurgically and electrically connect to conductive layer 196. Alternatively, where bumps are pre-formed over interconnect structure 190, bumps 256 are subsequently reflowed to metallurgically and electrically connect to conductive layer 254 of semiconductor die 244.

Figure 7D:
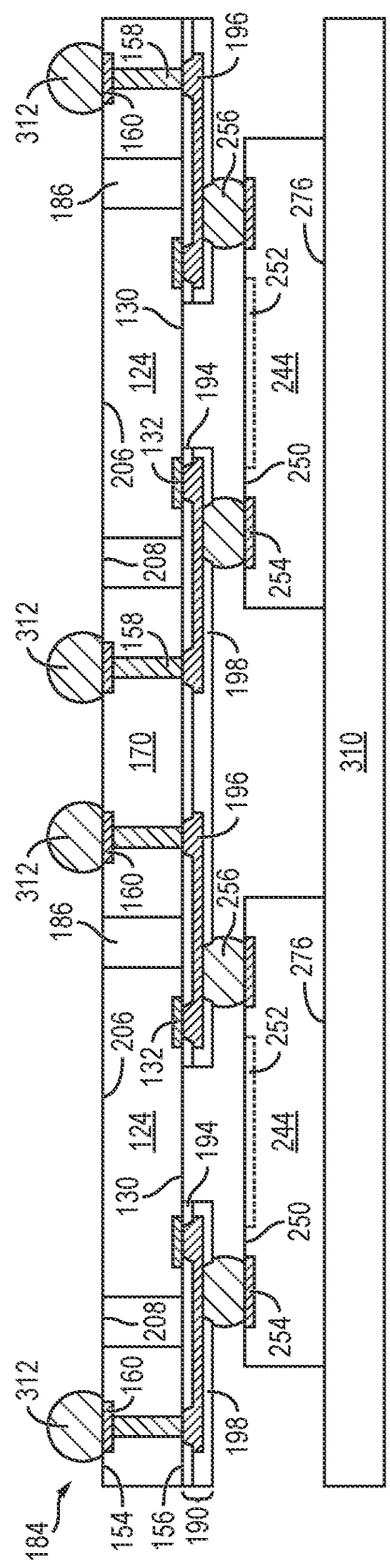

In FIG. 7d, temporary carrier 300 and optional interface layer 302 are removed by chemical etching, mechanical peel-off, CMP, mechanical grinding, thermal bake, laser scanning, or wet stripping. Surface 206 of semiconductor die 124 is exposed after carrier 300 and interface layer 302 are removed.

Semiconductor die 244 of reconstituted panel 184 are disposed over a thermal tape or support tape 310. In one embodiment, support tape 310 includes a thermally resistant tape, warpage balancing tape, or other tape. For example, support tape 310 may include a material having high thermal conductivity and high heat resistance. Alternatively, reconstituted panel 184 is placed over a carrier or supporting jig with or without support tape 310.

An electrically conductive bump material is deposited over modular interconnect units 170 and electrically connected to conductive layer 160 using an evaporation, electrolytic plating, electroless plating, ball drop, or screen printing process. The bump material includes Al, Sn, Ni, Au, Ag, Pb, Bi, Cu, solder, or combinations thereof, with an optional flux solution. For example, the bump material can be eutectic Sn/Pb, high-lead solder, or lead-free solder. The bump material is bonded to conductive layer 160 using a suitable attachment or bonding process. In one embodiment, the bump material is reflowed by heating the material above its melting point to form spherical balls or bumps 312. In some applications, bumps 312 are reflowed a second time to improve electrical contact to conductive layer 160. The bumps can also be compression bonded to conductive layer 160. Bumps 312 represent one type of interconnect structure that is formed over conductive layer 160. The interconnect structure can also use bond wires, stud bump, micro bump, or other electrical interconnect.

In FIG. 7e, reconstituted panel 184 is singulated with saw blade or laser cutting device 314 through modular interconnect units 170 and interconnect structure 190 into individual semiconductor devices or PoP devices 316.

FIG. 7f shows PoP device 316 after singulation. PoP device 316 includes semiconductor die 244 mounted over interconnect structure 190 of a bottom PoP 318. Bottom PoP 318 includes semiconductor die 124 and modular interconnect units 170 disposed adjacent to semiconductor die 124 with encapsulant 186 formed around semiconductor die 124. Semiconductor die 244 electrically connects to semiconductor die 124 and modular interconnect units 170 through conductive layer 196. Semiconductor die 124 and 244 electrically connect to external devices through interconnect structure 190, modular interconnect units 170, and bumps 312. Modular interconnect units 170 provide electrical routing and reduce the amount of additional RDL formed over bottom PoP 318. Thus, a height of bottom PoP 318 in PoP device 316 is reduced. Additionally, PoP device 316 is formed at wafer-level by mounting semiconductor die 244 prior to singulating through modular interconnect units 170. Assembling PoP device 316 at the wafer-level reduces the cost to manufacture PoP device 316.

PoP device 316 operates as a MEMS device with integrated MEMS and ASIC semiconductor die. In one embodiment, semiconductor die 124 includes an ASIC and semiconductor die 244 includes a MEMS or other active or passive sensors responsive to various external stimuli. In another embodiment, semiconductor die 244 includes an ASIC and semiconductor die 124 includes a MEMS. In one embodiment, semiconductor die 244 includes a height $H_1$ of approximately 415 μm and bumps 256 include a standoff height $H_2$ of approximately 60 μm. Bottom PoP 318 with semiconductor die 124, modular interconnect units 170, and interconnect structure 190 includes a height $H_3$ of approximately 175 μm and bumps 312 include a standoff height $H_4$ of approximately 110 μm. In one embodiment, a total height $TH_{316}$ of PoP device 316 is approximately 760 μm.

Figure 8:
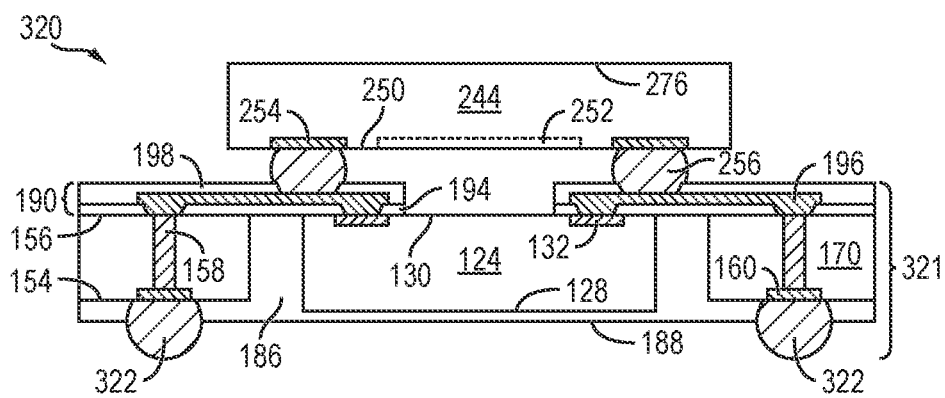
FIG. 8 illustrates a MEMS PoP device including a flip-chip semiconductor die stacked over a fan-out embedded wafer level ball grid array (Fo-eWLB)

FIG. 8 shows another PoP device 320 with a bottom PoP device formed with reconstituted panel 210 shown in FIG. 4f. PoP device 320 includes semiconductor die 244 mounted over interconnect structure 190 of a bottom PoP 321. Bottom PoP 321 includes modular interconnect units 170 disposed adjacent to semiconductor die 124. Encapsulant 186 is formed over and around semiconductor die 124 and modular interconnect units 170. Openings are formed in encapsulant 186 over modular interconnect units 170, and bumps 322 are formed in the openings. Bumps 322 are reflowed to metallurgically and electrically connect to conductive layer 160. Interconnect structure 190 includes insulating layers 194 and 198 and conductive layer 196 formed over modular interconnect units 170, encapsulant 186, and active surface 130 of semiconductor die 124. Interconnect structure 190 may include fewer or additional conductive and insulating layers. Interconnect structure 190 includes an optional non-routing area over active surface 130 of semiconductor die 124. PoP device 320 is formed at wafer-level by mounting semiconductor die 244 prior to singulating reconstituted panel 210 from FIG. 4f. Alternatively, PoP device 320 is formed at component-level by mounting semiconductor die 244 after singulating bottom PoP 321 from reconstituted panel 210. Thus, semiconductor die 244 is mounted over interconnect structure 190 to form PoP device 320 at the wafer-level or component-level.

PoP device 320 operates as a MEMS device with integrated MEMS and ASIC semiconductor die. In one embodiment, semiconductor die 124 includes a MEMS and semiconductor die 244 includes an ASIC. In another embodiment, semiconductor die 124 includes an ASIC and semiconductor die 244 includes a MEMS. Semiconductor die 244 electrically connects to semiconductor die 124 and modular interconnect units 170 through conductive layer 196. Semiconductor die 124 and 244 electrically connect to external devices through interconnect structure 190, modular interconnect units 170, and bumps 322. Modular interconnect units 170 provide electrical routing and reduce the amount of additional RDL formed over bottom PoP 321. Thus, a height of bottom PoP 321 in PoP device 320 is reduced.

Figure 9:
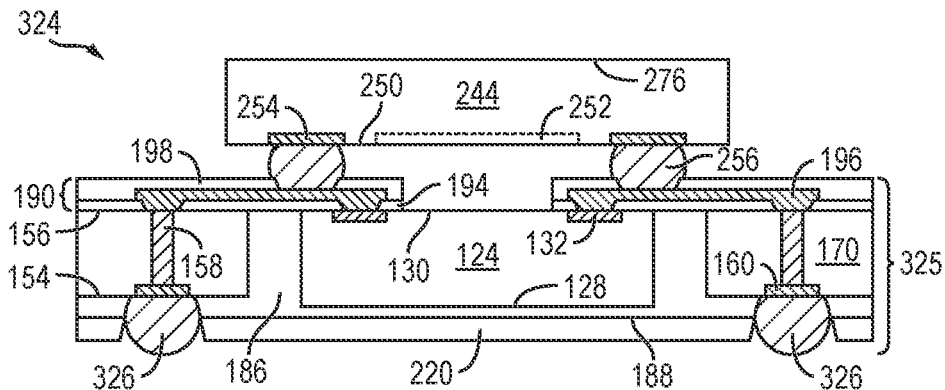
FIG. 9 illustrates a MEMS PoP device including a flip-chip semiconductor die stacked over a Fo-eWLB device with a warpage balance layer.

FIG. 9 shows another PoP device 324 with a bottom PoP device formed with a balance layer using the process shown in FIG. 4g. PoP device 324 includes semiconductor die 244 mounted over interconnect structure 190 of a bottom PoP 325. Bottom PoP 325 includes modular interconnect units 170 disposed adjacent to semiconductor die 124. Encapsulant 186 is formed over and around semiconductor die 124 and modular interconnect units 170. Balance layer 220 is formed over encapsulant 186 over a back surface 128 of semiconductor die 124. Openings are formed through balance layer 220 and encapsulant 186 over modular interconnect units 170, and bumps 326 are formed in the openings. Bumps 326 are reflowed to metallurgically and electrically connect to conductive layer 160. Interconnect structure 190 includes insulating layers 194 and 198 and conductive layer 196 formed over modular interconnect units 170, encapsulant 186, and active surface 130 of semiconductor die 124. Interconnect structure 190 may include fewer or additional conductive and insulating layers. Interconnect structure 190 includes an optional non-routing area over active surface 130 of semiconductor die 124. PoP device 324 is formed at wafer-level by mounting semiconductor die 244 prior to singulating reconstituted panel 218 from FIG. 4g. Alternatively, PoP device 324 is formed at component-level by mounting semiconductor die 244 after singulating bottom PoP 325 from reconstituted panel 218. Thus, semiconductor die 244 is mounted over interconnect structure 190 to form PoP device 324 at the wafer-level or component-level.

PoP device 324 operates as a MEMS device with integrated MEMS and ASIC semiconductor die. In one embodiment, semiconductor die 124 includes a MEMS and semiconductor die 244 includes an ASIC. In another embodiment, semiconductor die 124 includes an ASIC and semiconductor die 244 includes a MEMS. Semiconductor die 244 electrically connects to semiconductor die 124 and modular interconnect units 170 through conductive layer 196. Semiconductor die 124 and 244 electrically connect to external devices through interconnect structure 190, modular interconnect units 170, and bumps 326. Modular interconnect units 170 provide electrical routing and reduce the amount of additional RDL formed over bottom PoP 325. Thus, a height of bottom PoP 325 in PoP device 324 is reduced.

Figure 10:
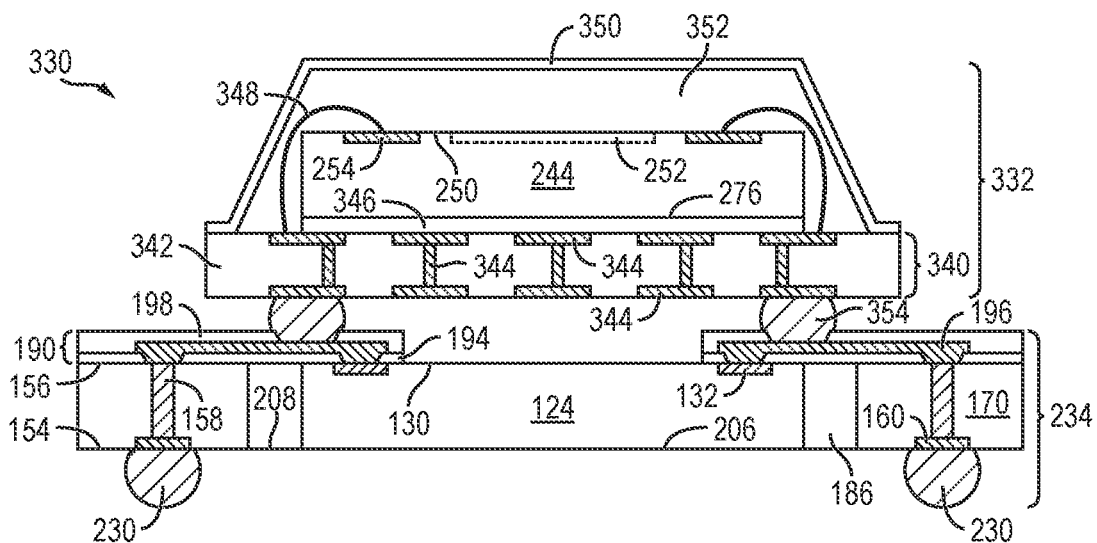
FIG. 10 illustrates a PoP device including a wirebond semiconductor package stacked over a Fo-eWLB device with modular interconnect units.

FIG. 10 shows an alternative PoP device 330 with a wirebond semiconductor package mounted over a Fo-eWLB device. PoP device 330 includes a top PoP 332 disposed over a bottom PoP device, such as bottom PoP 234. Top PoP 332 includes semiconductor die 244 without bumps disposed over a substrate or interposer 340. In another embodiment, semiconductor die 244 is mounted to interposer 340 using bumps. Interposer 340 can be a laminate interposer, PCB, wafer-form, or strip interposer. Interposer 340 includes one or more insulating or passivation layers 342 and one or more conductive layers 344. Interposer 340 may include one or more laminated layers of prepreg, FR-4, FR-1, CEM-1, or CEM-3 with a combination of phenolic cotton paper, epoxy, resin, woven glass, matte glass, polyester, and other reinforcement fibers or fabrics. Insulating layers 342 may contain one or more layers of SiO2, Si3N4, SiON, Ta2O5, Al2O3, or other material having similar insulating and structural properties. Interposer 340 can also be a multi-layer flexible laminate, ceramic, copper foil, glass, or semiconductor wafer including an active surface containing one or more transistors, diodes, and other circuit elements to implement analog circuits or digital circuits.

Interposer 340 includes an electrically conductive layer or RDL 344 formed using sputtering, electrolytic plating, electroless plating, or other suitable deposition process. Conductive layer 344 can be one or more layers of Al, Cu, Sn, Ni, Au, Ag, Ti, W, or other suitable electrically conductive material. Conductive layers 344 provide vertical and horizontal conduction paths through interposer 340. Portions of conductive layers 344 are electrically common or electrically isolated according to the design and function of the semiconductor die to be mounted to interposer 340.

Semiconductor die 244 is mounted to interposer 340 with die attach adhesive or film 346, such as epoxy resin. In another embodiment, die attach adhesive 346 includes a thermal interface material (TIM) such as thermal epoxy, thermal epoxy resin, thermal conductive paste, aluminum oxide, zinc oxide, boron nitride, pulverized silver, or thermal grease. Die attach adhesive 346 is cured to secure semiconductor die 244 to interposer 340. In one embodiment, semiconductor die 244 is mounted to interposer 340 at the wafer-level or panel-level in a chip-on-wafer assembly. Semiconductor die 244 is a KGD having been tested prior to mounting to interposer 340.

A plurality of bond wires 348 is formed between interposer 340 and contact pads 254 of semiconductor die 244. Bond wires 348 are mechanically and electrically coupled to conductive layer 344 of interposer 340 and to contact pads 254 of semiconductor die 244 by thermocompression bonding, ultrasonic bonding, wedge bonding, stitch bonding, ball bonding, or other suitable bonding technique. Bond wires 348 include a conductive material such as Cu, Al, Au, Ag, metal alloy, or a combination thereof. Semiconductor die 244 is electrically connected to interposer 340 using bond wires 348. Bond wires 348 represent one type of interconnect structure that electrically couples semiconductor die 244 to interposer 340. In another embodiment, an electrically conductive layer, such as an RDL, is used instead of bond wires 348 to electrically couple semiconductor die 244 to interposer 340.

A protective cover or lid 350 is mounted over semiconductor die 244, bond wires 348, and interposer 340. In one embodiment, lid 350 includes a metal having a low thermal conductivity or another material having low thermal conductivity. In another embodiment, lid 350 includes a sacrificial base material such as silicon, polymer, beryllium oxide, glass, or other suitable low-cost, rigid material. Alternatively, lid 350 operates as a heat spreader and includes Cu, Al, or other material with high thermal conductivity. In yet another embodiment, lid 350 operates as a shielding layer and includes Al, ferrite or carbonyl iron, stainless steel, nickel silver, low-carbon steel, silicon-iron steel, foil, conductive resin, or other metals and composites capable of blocking or absorbing electromagnetic interference (EMI), RF interference, harmonic distortion, and other inter-device interference.

Lid 350 is disposed over the individual semiconductor die 244 over interposer 340 at the wafer or panel-level. In one embodiment, lid 284 is attached to interposer 340 using an adhesive material, such as epoxy resin or thermal epoxy. The adhesive material is cured to secure lid 350 to interposer 340. In another embodiment, lid 350 is attached to interposer 340 using a bump material, such as Al, Sn, Ni, Au, Ag, Pb, Bi, Cu, solder, or combinations thereof. The bump material is reflowed by heating the material above its melting point to form balls or bumps. Lid 350 forms a cavity or relief area 352 over semiconductor die 244, bond wires 348, and interposer 340. In one embodiment, lid 350 includes an opening over active region 252 of semiconductor die 244. Lid 350 operates to protect bond wires 348 and active region 252 of semiconductor die 244. Interposer 340 is singulated into individual top PoP 332 before or after mounting semiconductor die 244 and lid 350 to interposer 340.

An electrically conductive bump material is deposited over interposer 340 and electrically connected to conductive layer 344 using an evaporation, electrolytic plating, electroless plating, ball drop, or screen printing process. The bump material includes Al, Sn, Ni, Au, Ag, Pb, Bi, Cu, solder, or combinations thereof, with an optional flux solution. For example, the bump material can be eutectic Sn/Pb, high-lead solder, or lead-free solder. The bump material is bonded to conductive layer 344 using a suitable attachment or bonding process. In one embodiment, the bump material is reflowed by heating the material above its melting point to form spherical balls or bumps 354. In some applications, bumps 354 are reflowed a second time to improve electrical contact to conductive layer 344. The bumps can also be compression bonded to conductive layer 344. Bumps 354 represent one type of interconnect structure that is formed over conductive layer 344. The interconnect structure can also use bond wires, stud bump, micro bump, or other electrical interconnect. In one embodiment, bumps 354 are pre-formed over interconnect structure 190 of bottom PoP 234, instead of over interposer 340, prior to mounting top PoP 332. Where bumps 354 are pre-formed over bottom PoP 234, interposer 340 without bumps is mounted to bottom PoP 234.

Top PoP 332 is mounted over bottom PoP 234 and bumps 354 are reflowed to metallurgically and electrically connect top PoP 332 with bottom PoP 234. Semiconductor die 244 electrically connects to semiconductor die 124 and modular interconnect units 170 through bond wires 348, interposer 340, bumps 354, and interconnect structure 190. Semiconductor die 124 and 244 electrically connect to external devices through interconnect structure 190, modular interconnect units 170, and bumps 230. PoP device 330 operates as a MEMS package with integrated MEMS and ASIC semiconductor die. In one embodiment, semiconductor die 124 includes an ASIC and semiconductor die 244 includes a MEMS or other active or passive sensors responsive to various external stimuli. In another embodiment, semiconductor die 244 includes an ASIC and semiconductor die 124 includes a MEMS.

Figure 11:
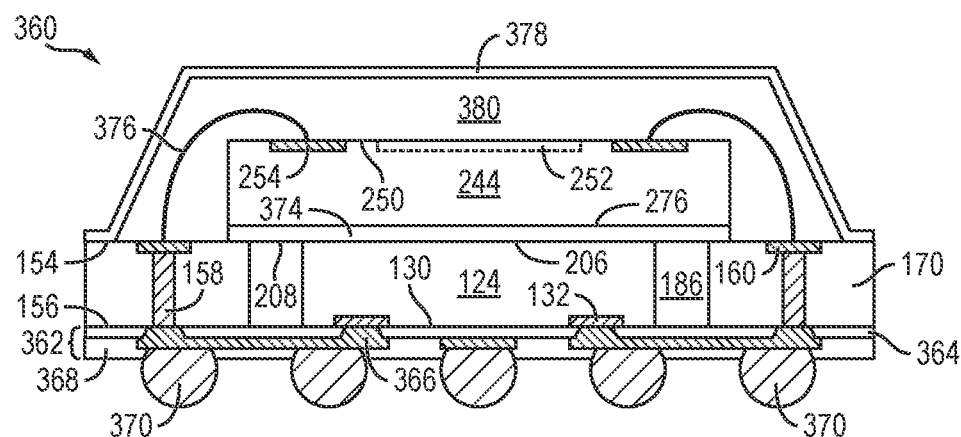
FIG. 11 illustrates a MEMS package including a MEMS semiconductor die mounted over a Fo-eWLB device with modular interconnect units.

FIG. 11 shows a MEMS package 360 including a MEMS semiconductor die mounted over a Fo-eWLB device with modular interconnect units. Encapsulant 186 is formed around semiconductor die 124 and modular interconnect units 170. A portion of encapsulant 186 is removed to form a thinner package and expose back surface 206 of semiconductor die 124 with respect to encapsulant 186. Interconnect structure 362 is formed over active surface 130 of semiconductor die 124, over surface 156 of modular interconnect units 170, and over encapsulant 186 to extend electrical interconnection of semiconductor die 124 to outside a footprint of the die.

Interconnect structure 362 includes an insulating or passivation layer 364 formed over semiconductor die 124 and encapsulant 186 using PVD, CVD, printing, spin coating, spray coating, sintering or thermal oxidation. Insulating layer 364 can be one or more layers of SiO2, Si3N4, SiON, Ta2O5, Al2O3, BCB, epoxy based photosensitive polymer dielectric, low temperature (≤200° C.) curable polymer, or other material having similar insulating and structural properties. In one embodiment, insulating layer 364 includes a low temperature curing photosensitive dielectric polymer with or without insulating fillers cured at less than 200° C. Insulating layer 364 is formed over active surface 130 of semiconductor die 124 and over encapsulant 186 and modular interconnect units 170. A portion of insulating layer 364 is removed by an etching process with a patterned photoresist layer or by LDA to expose conductive layer 132 and conductive vias 158 with respect to insulating layer 364.

An electrically conductive layer 366 is formed over insulating layer 364, conductive vias 158, and contact pads 132 using a patterning and metal deposition process such as PVD, CVD, sputtering, electrolytic plating, and electroless plating. Conductive layer 366 can be one or more layers of Al, Cu, Sn, Ni, Au, Ag, or other suitable electrically conductive material. Conductive layer 366 operates as an RDL to redistribute the electrical signals of semiconductor die 124. One portion of conductive layer 366 is electrically connected to contact pads 132 of semiconductor die 124. Other portions of conductive layer 366 can be electrically common or electrically isolated depending on the design and function of the semiconductor device. Conductive layer 366 electrically connects contact pads 132 of semiconductor die 124 to conductive vias 158 of modular interconnect units 170.

An insulating or passivation layer 368 is formed over insulating layer 364 and conductive layer 366 using PVD, CVD, printing, spin coating, spray coating, sintering or thermal oxidation. Insulating layer 368 can be one or more layers of SiO2, Si3N4, SiON, Ta2O5, Al2O3, BCB, epoxy based photosensitive polymer dielectric, low temperature (≤200° C.) curable polymer, or other material having similar insulating and structural properties. In one embodiment, insulating layer 368 includes a low temperature curing photosensitive dielectric polymer with or without insulating fillers cured at less than 200° C. A portion of insulating layer 368 is removed by an etching process with a patterned photoresist layer or by LDA to expose conductive layer 366 with respect to insulating layer 368.

An electrically conductive bump material is deposited over conductive layer 366 of interconnect structure 362 and is electrically connected to conductive layer 132 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 366 using a suitable attachment or bonding process. In one embodiment, the bump material is reflowed by heating the material above its melting point to form spherical balls or bumps 370. In some applications, bumps 370 are reflowed a second time to improve electrical contact to conductive layer 366. The bumps can also be compression bonded to conductive layer 366. Bumps 370 represent one type of interconnect structure that can be formed over conductive layer 366. The interconnect structure can also use bond wires, stud bump, micro bump, or other electrical interconnect.

Semiconductor die 244 is mounted with a back surface 276 oriented toward back surface 206 of semiconductor die 124 and surface 208 of encapsulant 186 with die attach adhesive 374. Semiconductor die 244 includes active surface 250 containing an active region 252. In one embodiment, semiconductor die 124 includes an ASIC and semiconductor die 244 includes a MEMS or other active or passive sensors responsive to various external stimuli. In another embodiment, semiconductor die 124 includes a MEMS and semiconductor die 244 includes an ASIC. Semiconductor die 244 includes an electrically conductive layer 254 formed over active surface 250. Conductive layer 254 operates as contact pads electrically connected to the circuits on active surface 250.

Bond wires or interconnect structures 376 electrically couple semiconductor die 244 to modular interconnect units 170. Bond wires 376 are mechanically and electrically coupled to conductive layer 160 of modular interconnect units 170 and to contact pads 254 of semiconductor die 244 by thermocompression bonding, ultrasonic bonding, wedge bonding, stitch bonding, ball bonding, or other suitable bonding technique. In another embodiment, a conductive layer or RDL is formed over contact pads 254 of semiconductor die 244 and conductive layer 160 of modular interconnect units 170 in order to electrically connect semiconductor die 244 to modular interconnect units 170.

A protective cover or lid 378 is mounted over semiconductor die 244, bond wires 376, and modular interconnect units 170. Lid 378 may include an opening over active region 252, depending on the design of semiconductor die 244. Lid 378 is mounted to modular interconnect units 170 using a suitable attachment or bonding process. Lid 378 forms a cavity or relief area 380 over semiconductor die 244, semiconductor die 124, and bond wires 376. Lid 378 operates to protect active region 252 of semiconductor die 244 and bond wires 376. MEMS package 360 is formed at the component-level or wafer-level and is singulated through modular interconnect units 170 and interconnect structure 362 before or after mounting semiconductor die 244.

Semiconductor die 244 electrically connects to modular interconnect units 170 through bond wires 376 and to semiconductor die 124 and through bond wires 376 and interconnect structure 362. Semiconductor die 244 electrically connects to external devices through bond wires 376, modular interconnect units 170, interconnect structure 362, and bumps 370. Semiconductor die 124 electrically connects to external devices through interconnect structure 362 and bumps 370.

Figure 12:
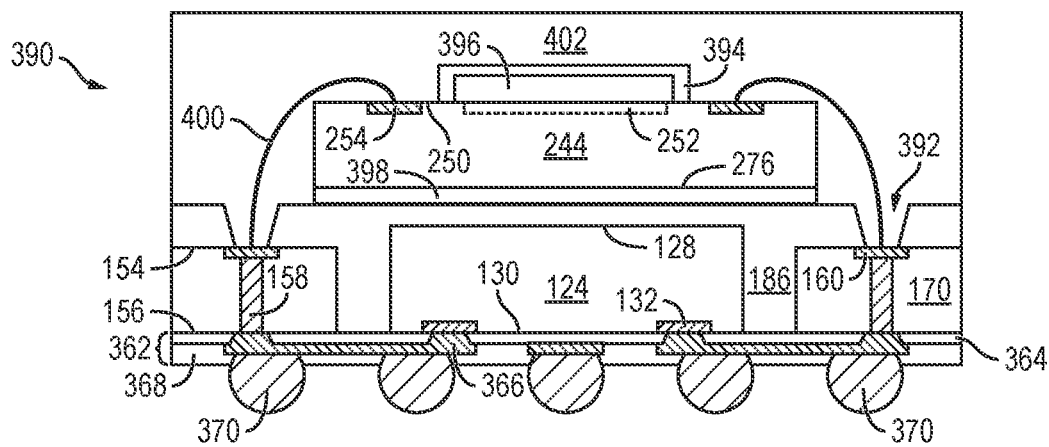
FIG. 12 illustrates another MEMS package including a MEMS semiconductor die mounted over a Fo-eWLB device with modular interconnect units.

FIG. 12 shows another MEMS package 390 including a MEMS semiconductor die mounted over a Fo-eWLB device with modular interconnect units. Encapsulant 186 is formed over semiconductor die 124 and modular interconnect units 170. A portion of encapsulant 186 is optionally removed to form a thinner package and expose back surface 128 of semiconductor die 124 with respect to encapsulant 186. Interconnect structure 362 is formed over semiconductor die 124, modular interconnect units 170, and encapsulant 186 to extend electrical interconnection of semiconductor die 124 to outside a footprint of the die. Interconnect structure 362 includes insulating layers 364 and 368, conductive layer 366, and may include fewer or additional conductive and insulating layers. Bumps 370 are formed over conductive layer 366 of interconnect structure 362. Openings 392 are formed in encapsulant 186 to provide for wire bonding through encapsulant 186 to modular interconnect units 170.

Semiconductor die 244 includes a cover or cap 394 disposed over active region 252 of semiconductor die 244. Cap 394 contains glass, silicon, or other suitable base material. Cap 394 completely covers active region 252 and is attached to active surface 250 with a sealing material to form a cavity 396 over active region 252 of semiconductor die 244. Cavity 396 operates as a sealed area directly over active region 252 to protect active region 252.

Semiconductor die 244 is mounted to encapsulant 186 with die attach adhesive 398. Die attach adhesive 398 allows heat transfer between semiconductor die 124 and semiconductor die 244 to improve the thermal performance of MEMS package 390. In an alternative embodiment, where encapsulant 186 is removed from over semiconductor die 124, semiconductor die 244 is mounted directly to semiconductor die 124 with die attach adhesive 398.

Bond wires or interconnect structures 400 electrically couple semiconductor die 244 to modular interconnect units 170. Bond wires 400 are mechanically and electrically coupled to conductive layer 160 of modular interconnect units 170 and to contact pads 254 of semiconductor die 244 by thermocompression bonding, ultrasonic bonding, wedge bonding, stitch bonding, ball bonding, or other suitable bonding technique. In another embodiment, a conductive layer or RDL is formed over contact pads 254 of semiconductor die 244 and conductive layer 160 of modular interconnect units 170 in order to electrically connect semiconductor die 244 to modular interconnect units 170.

An encapsulant or molding compound 402 is deposited over semiconductor die 244, bond wires 400, and encapsulant 186 as an insulating material using a paste printing, compressive molding, transfer molding, liquid encapsulant molding, vacuum lamination, spin coating, or other suitable applicator. Encapsulant 402 includes polymer composite material, such as epoxy resin with filler, epoxy acrylate with filler, or polymer with proper filler. Encapsulant 402 is non-conductive and environmentally protects the semiconductor device from external elements and contaminants. In one embodiment, MEMS package 390 is formed at the wafer-level and is singulated through modular interconnect units 170, encapsulants 186 and 402, and interconnect structure 362 after mounting semiconductor die 244.

MEMS package 390 operates as a MEMS device with integrated MEMS and ASIC semiconductor die. In one embodiment, semiconductor die 124 includes a MEMS and semiconductor die 244 includes an ASIC. In another embodiment, semiconductor die 124 includes an ASIC and semiconductor die 244 includes a MEMS. Semiconductor die 124 is electrically connected to external devices through interconnect structure 362 and bumps 370. Semiconductor die 244 is electrically connected to semiconductor die 124 and to external devices through bond wires 400, modular interconnect units 170, interconnect structure 362, and bumps 370. Modular interconnect units 170 provide electrical routing and reduce the amount of additional RDL formed over the bottom PoP device. Thus, a height of the bottom PoP device in MEMS package 390 is reduced. Additionally, MEMS package 390 is formed using a reconstituted panel on a standardized carrier. Therefore, MEMS package 390 is manufactured using standardized processing tools, equipment, and bill of materials, thereby reducing the cost of manufacturing.

Figure 13:
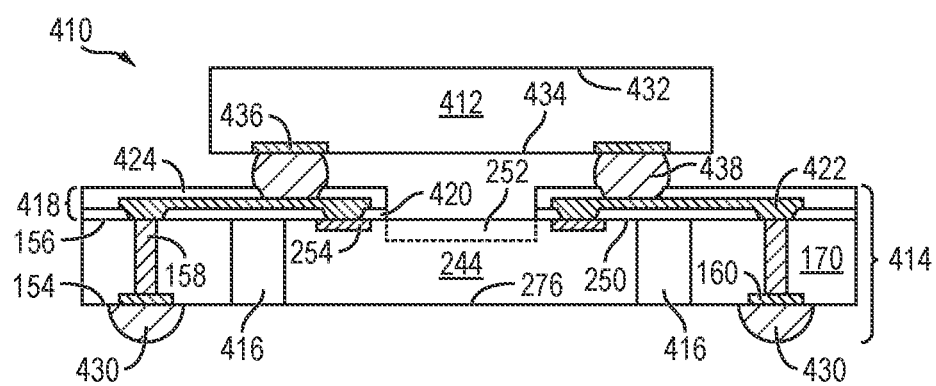
FIG. 13 illustrates a MEMS PoP device including a flip-chip semiconductor die stacked over a Fo-eWLB device with modular interconnect units.

FIG. 13 shows an alternative PoP device 410 with a semiconductor die 412 disposed over a bottom PoP 414. Bottom PoP 414 is similar to bottom PoP 234 from FIG. 4k. Bottom PoP 414 includes modular interconnect units 170 disposed adjacent to semiconductor die 244. Encapsulant 416 is deposited around semiconductor die 244 and modular interconnect units 170. A portion of encapsulant 416 is removed to form a thinner package and expose back surface 276 of semiconductor die 244 with respect to encapsulant 416. Interconnect structure 418 is formed over semiconductor die 244, modular interconnect units 170, and encapsulant 416 to extend electrical interconnection of semiconductor die 244 to outside a footprint of the die. Interconnect structure 418 is similar to interconnect structure 190 and includes insulating layer 420 and conductive layer 422 formed over active surface 250 of semiconductor die 244, over encapsulant 416, and surface 156 of modular interconnect units 170. Insulating layer 424 is formed over conductive layer 422 and insulating layer 420. Interconnect structure 418 may include fewer or additional conductive and insulating layers.

An electrically conductive bump material is deposited over conductive layer 160 of modular interconnect units 170 using an evaporation, electrolytic plating, electroless plating, ball drop, or screen printing process. The bump material includes Al, Sn, Ni, Au, Ag, Pb, Bi, Cu, solder, or combinations thereof, with an optional flux solution. For example, the bump material can be eutectic Sn/Pb, high-lead solder, or lead-free solder. The bump material is bonded to conductive layer 160 using a suitable attachment or bonding process. In one embodiment, the bump material is reflowed by heating the material above its melting point to form spherical or dome-shaped balls or bumps 430. In some applications, bumps 430 are reflowed a second time to improve electrical contact to conductive layer 160. The bumps can also be compression bonded to conductive layer 160. Bumps 430 represent one type of interconnect structure that is formed over conductive layer 160. The interconnect structure can also use bond wires, stud bump, micro bump, or other electrical interconnect. In one embodiment, bumps 430 are formed with a dome-shape and a reduced height compared to spherical ball-shaped bumps in order to improve subsequent pick and place handling of individual bottom PoP 414.

Semiconductor die 412 is similar to semiconductor die 124. Semiconductor die 412 includes a back or non-active surface 432 and an active surface 434 containing analog or digital circuits implemented as active devices, passive devices, conductive layers, and dielectric layers formed within the die and electrically interconnected according to the electrical design and function of the die.

An electrically conductive layer 436 is formed over active surface 434 using PVD, CVD, electrolytic plating, electroless plating process, or other suitable metal deposition process. Conductive layer 436 includes one or more layers of Al, Cu, Sn, Ni, Au, Ag, or other suitable electrically conductive material or combination thereof. Conductive layer 436 operates as contact pads electrically connected to the circuits on active surface 434.

An electrically conductive bump material is deposited over conductive layer 436 of semiconductor die 412 using an evaporation, electrolytic plating, electroless plating, ball drop, or screen printing process. The bump material includes Al, Sn, Ni, Au, Ag, Pb, Bi, Cu, solder, or combinations thereof, with an optional flux solution. For example, the bump material can be eutectic Sn/Pb, high-lead solder, or lead-free solder. The bump material is bonded to conductive layer 436 using a suitable attachment or bonding process. In one embodiment, the bump material is reflowed by heating the material above its melting point to form spherical balls or bumps 438. In some applications, bumps 438 are reflowed a second time to improve electrical contact to conductive layer 436. The bumps can also be compression bonded to conductive layer 436. Bumps 438 represent one type of interconnect structure that is formed over conductive layer 436. The interconnect structure can also use bond wires, stud bump, micro bump, or other electrical interconnect. In one embodiment, bumps 438 are pre-formed over interconnect structure 418 of bottom PoP 414, instead of over semiconductor die 412, prior to mounting semiconductor die 412. Where bumps 438 are pre-formed over bottom PoP 414, a semiconductor die 412 without bumps is mounted to bottom PoP 414.

Prior to mounting semiconductor die 412, back surface 432 of semiconductor die 412 undergoes an optional backgrinding operation at the wafer level to remove a portion of base material and reduce the thickness of semiconductor die 412. Individual semiconductor die 412 can be inspected and electrically tested for identification of KGD post singulation.

Semiconductor die 412 is positioned over and mounted to bottom PoP 414. Bumps 438 are reflowed to metallurgically and electrically connect to conductive layer 422 of interconnect structure 418. Alternatively, where bumps 438 are pre-formed over interconnect structure 418, bumps 438 are subsequently reflowed to metallurgically and electrically connect to conductive layer 436 of semiconductor die 412. Semiconductor die 412 electrically connects to semiconductor die 244 and modular interconnect units 170 through conductive layer 422. Semiconductor die 244 and 412 electrically connect to external devices through interconnect structure 418, modular interconnect units 170, and bumps 430. Modular interconnect units 170 provide electrical routing and reduce the amount of additional RDL formed over bottom PoP 414. Thus, a height of bottom PoP 414 in PoP device 410 is reduced.

PoP device 410 operates as a MEMS package with integrated MEMS and ASIC semiconductor die. In one embodiment, semiconductor die 412 includes an ASIC and semiconductor die 244 includes a MEMS or other active or passive sensors responsive to various external stimuli. In another embodiment, semiconductor die 244 includes an ASIC and semiconductor die 412 includes a MEMS. PoP device 410 is formed at wafer-level by mounting semiconductor die 412 prior to singulating through modular interconnect units 170. Alternatively, PoP device 410 is formed at component-level by mounting semiconductor die 412 after singulating through modular interconnect units 170 into bottom PoP 414 from a reconstituted panel. Thus, semiconductor die 412 is mounted over interconnect structure 418 of bottom PoP 414 to form PoP device 410 at the wafer-level or component-level.

Figure 14A:
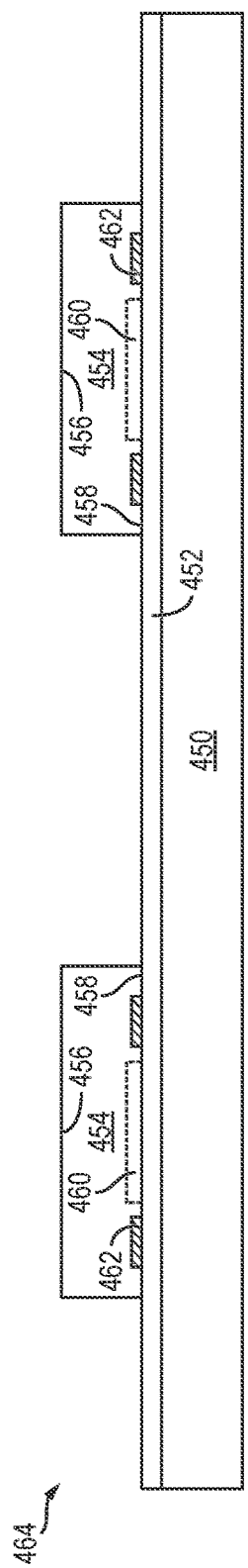

FIGS. 14a-14f illustrate, in relation to FIG. 1, a method of forming a MEMS eWLB top PoP device. FIG. 14a shows a cross-sectional view of a portion of a carrier or temporary substrate 450 containing sacrificial base material such as silicon, polymer, beryllium oxide, glass, or other suitable low-cost, rigid material for structural support. An interface layer or double-sided tape 452 is formed over carrier 450 as a temporary adhesive bonding film, etch-stop layer, or thermal release layer.

Carrier 450 can be a round or rectangular panel (greater than 300 mm) with capacity for multiple semiconductor die 454. Carrier 450 may have a larger surface area than the surface area of a semiconductor wafer containing semiconductor die 454. A larger carrier reduces the manufacturing cost of the semiconductor package as more semiconductor die can be processed on the larger carrier thereby reducing the cost per unit. Semiconductor packaging and processing equipment is designed and configured for the size of the wafer or carrier being processed.

To further reduce manufacturing costs, the size of carrier 450 is selected independent of the size of semiconductor die 454 or the size of the semiconductor wafer. That is, carrier 450 has a fixed or standardized size, which can accommodate various size semiconductor die 454 singulated from one or more semiconductor wafers. In one embodiment, carrier 450 is circular with a diameter of 330 mm. In another embodiment, carrier 450 is rectangular with a width of 560 mm and length of 600 mm. Semiconductor die 454 may have dimensions of 10 mm by 10 mm, which are placed on the standardized carrier 450. Alternatively, semiconductor die 454 may have dimensions of 20 mm by 20 mm, which are placed on the same standardized carrier 450. Accordingly, standardized carrier 450 can handle any size semiconductor die 454, which allows subsequent semiconductor processing equipment to be standardized to a common carrier, i.e., independent of die size or incoming wafer size. Semiconductor packaging equipment can be designed and configured for a standard carrier using a common set of processing tools, equipment, and bill of materials to process any semiconductor die size from any incoming wafer size. The common or standardized carrier 450 lowers manufacturing costs and capital risk by reducing or eliminating the need for specialized semiconductor processing lines based on die size or incoming wafer size. By selecting a predetermined carrier size to use for any size semiconductor die from all semiconductor wafer sizes, a flexible manufacturing line can be implemented.

FIG. 14a shows semiconductor die 454, which are similar to semiconductor die 124 from FIG. 2d and formed according to the process shown in FIGS. 5a-5f, but without bumps formed over semiconductor die 454 at the wafer level. Each semiconductor die 454 has a back or non-active surface 456 and an active surface 458 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 458 to implement analog circuits or digital circuits, such as DSP, ASIC, MEMS, memory, or other signal processing circuit. In one embodiment, active surface 458 contains an active region 460 including a MEMS or other active or passive sensors responsive to various external stimuli. An active sensor, such as a photodiode, a phototransistor, or a Hall effect device, generates or controls the flow of electrical current in response to an external stimulus. A passive sensor, such as a photoresistor, thermistor, capacitive accelerometer, or load cell, alters the relationship between voltage and current in response to the external stimulus. The external stimulus can be light, sound, electromagnetic radiation, electric field, magnetic field, ionizing radiation, vibration, motion, acceleration, rotation, orientation, pressure, or temperature. Active region 460 may include piezoelectric and nanoelectronic devices. Active region 460 is electrically connected to other analog and digital circuits on active surface 458 of semiconductor die 454 to perform functions in response to the external stimulus. An optional cover or cap may be disposed over active region 460 of semiconductor die 454 to protect active region 460.

An electrically conductive layer 462 is formed over active surface 458 using PVD, CVD, electrolytic plating, electroless plating process, or other suitable metal deposition process. Conductive layer 462 includes one or more layers of Al, Cu, Sn, Ni, Au, Ag, or other suitable electrically conductive material or combination thereof. Conductive layer 462 operates as contact pads electrically connected to the circuits on active surface 458.

Semiconductor die 454 are mounted to interface layer 452 and over carrier 450 using, for example, a pick and place operation with active surface 458 oriented toward the carrier. FIG. 14a shows semiconductor die 454 mounted to interface layer 452 of carrier 450 as reconstituted panel or reconfigured wafer 464.

Reconstituted wafer or panel 464 can be processed into many types of semiconductor packages, including eWLB, fan-in WLCSP, eWLCSP, fan-out WLCSP, flipchip packages, 3D packages, PoP, or other semiconductor packages. Reconstituted panel 464 is configured according to the specifications of the resulting semiconductor package. In one embodiment, semiconductor die 454 are placed on carrier 450 in a high-density arrangement, i.e., 300 μm apart or less, for processing fan-in devices. The distance between semiconductor die 454 on carrier 450 is optimized for manufacturing the semiconductor packages at the lowest unit cost. The larger surface area of carrier 450 accommodates more semiconductor die 454 and lowers manufacturing cost as more semiconductor die 454 are processed per reconstituted panel 464. The number of semiconductor die 454 mounted to carrier 450 can be greater than the number of semiconductor die 454 singulated from a semiconductor wafer. Carrier 450 and reconstituted panel 464 provide the flexibility to manufacture many different types of semiconductor packages using different size semiconductor die 454 from different sized semiconductor wafers.

Figure 14B:
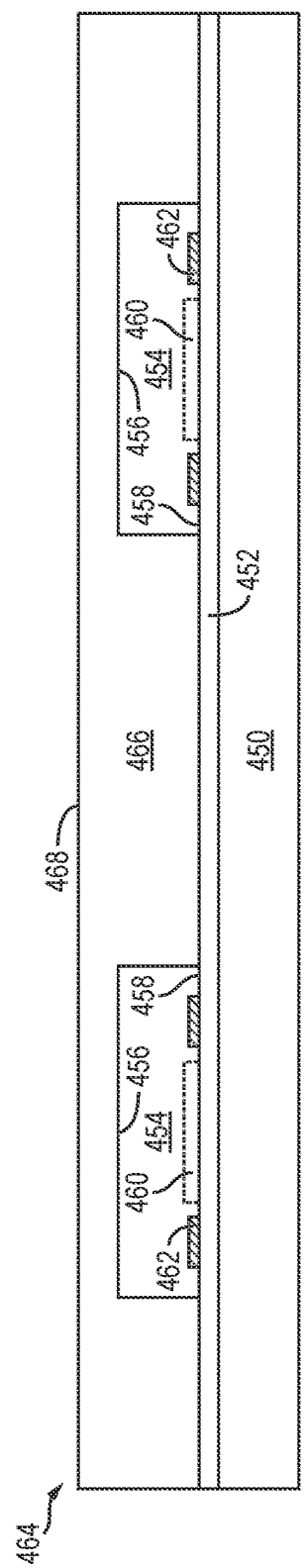

In FIG. 14b, an encapsulant or molding compound 466 is deposited over semiconductor die 454 and carrier 450 as an insulating material using a paste printing, compressive molding, transfer molding, liquid encapsulant molding, vacuum lamination, spin coating, or other suitable applicator. In particular, encapsulant 466 covers the side surfaces and back surface 456 of semiconductor die 454. Encapsulant 466 includes polymer composite material, such as epoxy resin with filler, epoxy acrylate with filler, or polymer with proper filler. Encapsulant 466 is non-conductive and environmentally protects the semiconductor device from external elements and contaminants. Encapsulant 466 includes surface 468 over back surface 456 of semiconductor die 454.

Figure 14C:
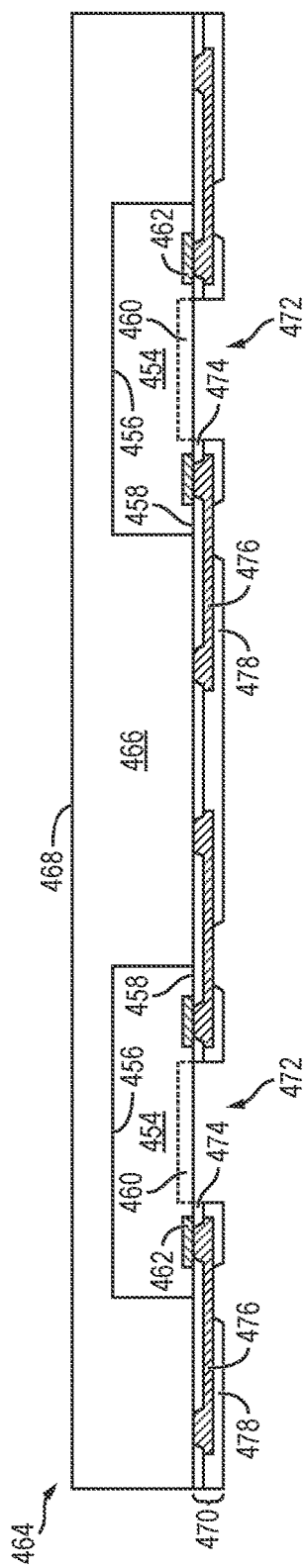

In FIG. 14c, temporary carrier 450 and optional interface layer 452 are removed by chemical etching, mechanical peel-off, CMP, mechanical grinding, thermal bake, laser scanning, or wet stripping. Active surface 458 of semiconductor die 454 is exposed after carrier 450 and interface layer 452 are removed.

A build-up interconnect structure 470 is formed over semiconductor die 454 and encapsulant 466, while a non-routing area 472 remains devoid of interconnect structure 470. Interconnect structure 470 includes an insulating or passivation layer 474 containing one or more layers of SiO2, Si3N4, SiON, Ta2O5, Al2O3, low temperature curable polymer dielectric resist (i.e., cures at less than 250° C.), BCB, PBO, epoxy based photosensitive polymer dielectric, or other material having similar insulating and structural properties. Insulating layer 474 is formed over active surface 458 of semiconductor die 454 and a surface of encapsulant 466 using PVD, CVD, printing, spin coating, spray coating, sintering or thermal oxidation. A portion of insulating layer 474 is removed by an etching process to expose contact pads 462 of semiconductor die 454. In one embodiment, non-routing area 472 remains devoid of insulating layer 474.

An electrically conductive layer 476 is formed over insulating layer 474 and conductive layer 462 using a patterning and metal deposition process such as PVD, CVD, sputtering, electrolytic plating, and electroless plating. Conductive layer 476 includes one or more layers of Al, Cu, Ti, TiW, tin Sn, Ni, Au, Ag, W, or other suitable electrically conductive material or combination thereof. Conductive layer 476 operates as an RDL to redistribute electrical connection from semiconductor die 454 to outside a footprint of semiconductor die 454. One portion of conductive layer 476 is electrically connected to contact pads 462 of semiconductor die 454. Other portions of conductive layer 476 are electrically common or electrically isolated depending on the design and function of the semiconductor device. In one embodiment, non-routing area 472 remains devoid of conductive layer 476.

An insulating or passivation layer 478 is formed over insulating layer 474 and conductive layer 476 using PVD, CVD, printing, spin coating, spray coating, sintering or thermal oxidation. Insulating layer 478 includes one or more layers of SiO2, Si3N4, SiON, Ta2O5, Al2O3, low temperature curable polymer dielectric resist (i.e., cures at less than 250° C.), BCB, PBO, or epoxy based photosensitive polymer dielectric, or other material having similar insulating and structural properties. A portion of insulating layer 478 is removed by LDA or an etching process through a patterned photoresist layer to expose portions of conductive layer 462. In one embodiment, non-routing area 472 remains devoid of insulating layer 478.

In FIG. 14d, an electrically conductive bump material is deposited over interconnect structure 470 and electrically connected to conductive layer 476 using an evaporation, electrolytic plating, electroless plating, ball drop, or screen printing process. The bump material includes Al, Sn, Ni, Au, Ag, Pb, Bi, Cu, solder, or combinations thereof, with an optional flux solution. For example, the bump material can be eutectic Sn/Pb, high-lead solder, or lead-free solder. The bump material is bonded to conductive layer 476 using a suitable attachment or bonding process. In one embodiment, the bump material is reflowed by heating the material above its melting point to form spherical balls or bumps 480. In some applications, bumps 480 are reflowed a second time to improve electrical contact to conductive layer 476. The bumps can also be compression bonded to conductive layer 476. Bumps 480 represent one type of interconnect structure that is formed over conductive layer 476. The interconnect structure can also use bond wires, stud bump, micro bump, or other electrical interconnect. Bumps 480 or other interconnect structures are optional, and in one embodiment, are not formed over interconnect structure 470. For example, interconnect structure 470 without bumps 480 operates as an LGA.

A groove or channel 484 is cut into encapsulant 466 using saw blade or laser cutting tool 486. Grooves 484 extend around a peripheral region of semiconductor die 454. Grooves 484 are formed with a depth greater than or equal to the final selected height of the semiconductor package. In one embodiment, grooves 484 have a depth of approximately 115 μm greater than the final height of the semiconductor package. The final height of the semiconductor package is formed during a subsequent backgrinding operation. In another embodiment, grooves 484 are formed partially through encapsulant 466 and have a depth of approximately 530 μm. After grooves 484 are formed, a portion of encapsulant 466 remains in a saw street area connecting semiconductor packages within reconstituted panel 464.

In FIG. 14e, surface 468 of encapsulant 466 undergoes a backgrinding operation with grinder 488 or other suitable mechanical or etching process to remove a portion of encapsulant 466 and reduce the thickness of reconstituted panel 464. The removal of encapsulant 466 leaves new back surface 490 of encapsulant 466. The backgrinding operation removes the remaining encapsulant 466 in the saw street are to separate the individual semiconductor packages or top PoP 492.

Figure 14F:
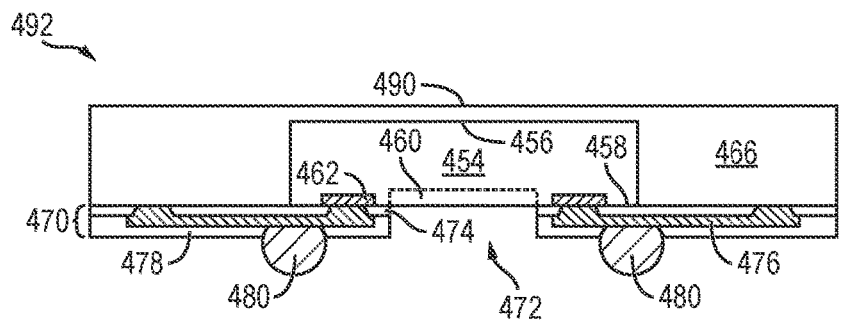

FIG. 14f shows top PoP 492 after the backgrinding operation. The backgrinding operation singulates top PoP 492 without using a dicing operation. In one embodiment, a height of top PoP 492 after backgrinding is approximately 415 μm. Top PoP 492 can be inspected and electrically tested for identification of KGD post singulation.

Figure 15A:
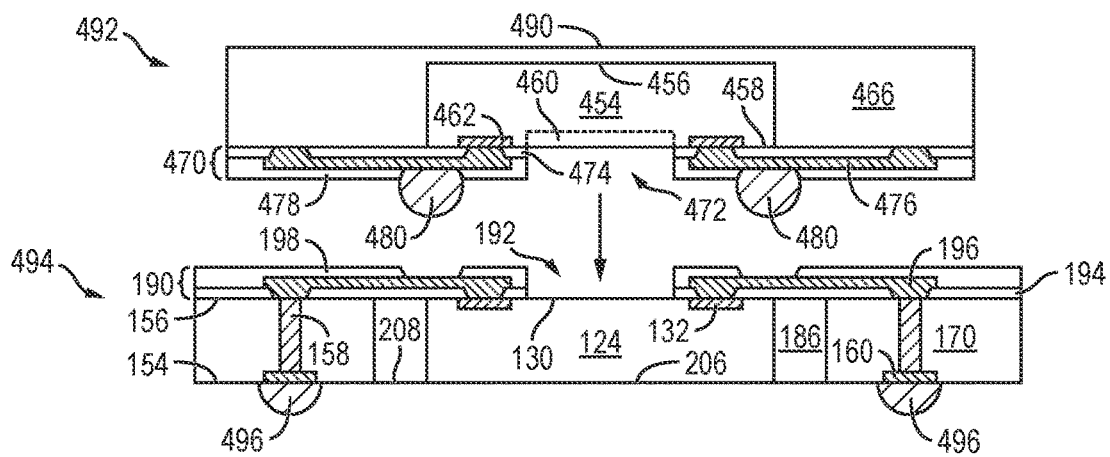
FIGS. 15a-15b illustrate a component-level assembly method of making a low-profile MEMS PoP device with a MEMS eWLB package stacked over a Fo-eWLB device.
Figure 15B:
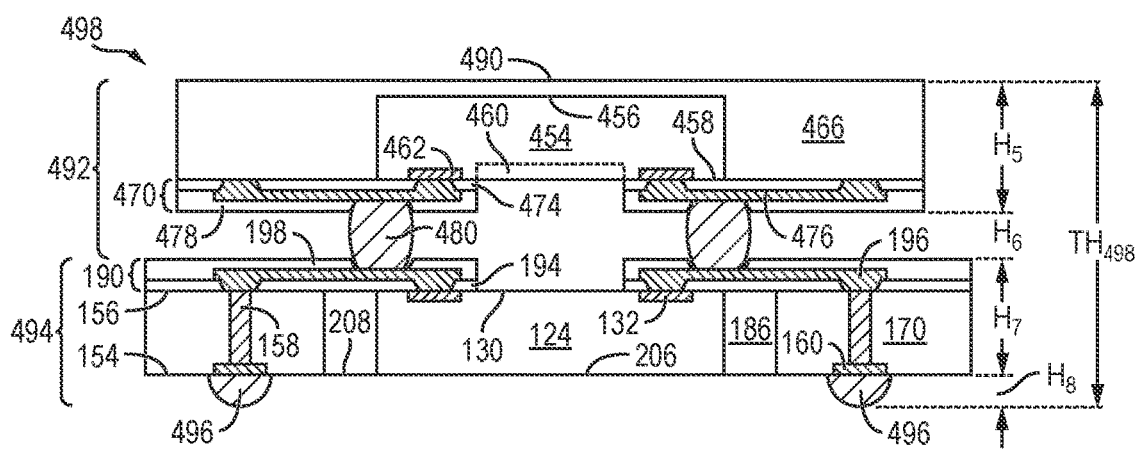

FIGS. 15a-15b show, in relation to FIGS. 1, 2a-2d, 3a-3b, 4a-4k, and 14a-14f, a method of forming a stacked MEMS package with an eWLB MEMS device as a top package. In FIG. 15a, a top PoP 492 from FIG. 14f is positioned over a bottom PoP 494, which is similar to bottom PoP 234 from FIG. 4k. Top PoP 492 is mounted to interconnect structure 190 of bottom PoP 494. Bumps 480 of top PoP 492 are positioned over openings in insulating layer 198 and contact conductive layer 196 on bottom PoP 494. In another embodiment, bumps 480 are pre-formed over conductive layer 196 on bottom PoP 494, and top PoP 492 without bumps is mounted over bottom PoP 494.

Bottom PoP 494 includes encapsulant 186 disposed around semiconductor die 124 and modular interconnect units 170. Interconnect structure 190 includes insulating layers 194 and 198 and conductive layer 196 formed over active surface 130 of semiconductor die 124. Interconnect structure 190 may include fewer or additional conductive and insulating layers. Interconnect structure 190 includes an optional non-routing area 192. Bumps 496 are formed over conductive layer 160 of modular interconnect units 170. In one embodiment, bumps 496 are formed with a dome-shape and a reduced height compared to spherical ball-shaped bumps in order to improve subsequent pick and place handling of individual bottom PoP 494.

FIG. 15b shows top PoP 492 mounted to bottom PoP 494 as a stacked PoP device 498. Bumps 480 are reflowed to metallurgically and electrically connect to conductive layer 196. Alternatively, where bumps are pre-formed over interconnect structure 190, bumps 480 are subsequently reflowed to metallurgically and electrically connect to conductive layer 476 of interconnect structure 470. Semiconductor die 454 electrically connects to semiconductor die 124 and modular interconnect units 170 through interconnect structure 470, bumps 480, and interconnect structure 190. Semiconductor die 124 and 454 electrically connect to external devices through interconnect structure 190, modular interconnect units 170, and bumps 496. Modular interconnect units 170 provide electrical routing and reduce the amount of additional RDL formed over bottom PoP 494. Thus, a height of the bottom PoP device in PoP device 498 is reduced.

PoP device 498 operates as a MEMS device with integrated MEMS and ASIC semiconductor die. In one embodiment, semiconductor die 124 includes an ASIC and semiconductor die 454 includes a MEMS or other active or passive sensors responsive to various external stimuli. In another embodiment, semiconductor die 454 includes an ASIC and semiconductor die 124 includes a MEMS. In one embodiment, top PoP 492 includes a height $H_5$ of approximately 415 μm and bumps 480 include a standoff height $H_6$ of approximately 60 μm. Bottom PoP 494 with semiconductor die 124, modular interconnect units 170, and interconnect structure 190 includes a height $H_7$ of approximately 175 μm and bumps 496 include a standoff height $H_8$ of approximately 110 μm. In one embodiment, a total height $TH_{498}$ of PoP device 498 is approximately 760 μm.

FIGS. 16a-16d show, in relation to FIGS. 1, 2a-2d, 3a-3b, 4a-4e, and 14a-14f, a wafer-level assembly method of making a low-profile MEMS PoP device with a MEMS eWLB package stacked over a Fo-eWLB device. Continuing from FIG. 4e, support tape 202 is removed from over reconstituted panel 184. Reconstituted panel 184 is disposed over and temporarily bonded to carrier or jig 510 with or without a supporting tape. In one embodiment, carrier 510 includes a temporary substrate containing sacrificial base material such as silicon, polymer, beryllium oxide, glass, or other suitable low-cost, rigid material for structural support.

Top PoP 492 from FIG. 14f are positioned over reconstituted panel 184 and mounted to interconnect structure 190. Bumps 480 are positioned over openings in insulating layer 198 and contact conductive layer 196. In another embodiment, bumps 480 are pre-formed over conductive layer 196 within openings in insulating layer 198 on reconstituted panel 184. A top PoP 492 without bumps is mounted to reconstituted panel 184. Bumps 480 are reflowed to metallurgically and electrically connect to conductive layer 196. Alternatively, where bumps 480 are pre-formed over interconnect structure 190, bumps 480 are subsequently reflowed to metallurgically and electrically connect to conductive layer 476 of interconnect structure 470.

In FIG. 16b, carrier 510 and optional supporting tape are removed from over reconstituted panel 184 by chemical etching, mechanical peel-off, CMP, mechanical grinding, thermal bake, laser scanning, or wet stripping. Surface 154 of modular interconnect units 170 and surface 206 of semiconductor die 124 are exposed after carrier 510 is removed.

Top PoP 492 on reconstituted panel 184 are disposed over a thermal tape or support tape 520. In one embodiment, support tape 520 includes a thermally resistant tape, warpage balancing tape, or other tape. For example, support tape 520 may include a material having high thermal conductivity and high heat resistance. Alternatively, reconstituted panel 184 is placed over a carrier or supporting jig with or without support tape 520.

An electrically conductive bump material is deposited over modular interconnect units 170 and electrically connected to conductive layer 160 using an evaporation, electrolytic plating, electroless plating, ball drop, or screen printing process. The bump material includes Al, Sn, Ni, Au, Ag, Pb, Bi, Cu, solder, or combinations thereof, with an optional flux solution. For example, the bump material can be eutectic Sn/Pb, high-lead solder, or lead-free solder. The bump material is bonded to conductive layer 160 using a suitable attachment or bonding process. In one embodiment, the bump material is reflowed by heating the material above its melting point to form spherical balls or bumps 522. In some applications, bumps 522 are reflowed a second time to improve electrical contact to conductive layer 160. The bumps can also be compression bonded to conductive layer 160. Bumps 522 represent one type of interconnect structure that is formed over conductive layer 160. The interconnect structure can also use bond wires, stud bump, micro bump, or other electrical interconnect.

Figure 16C:
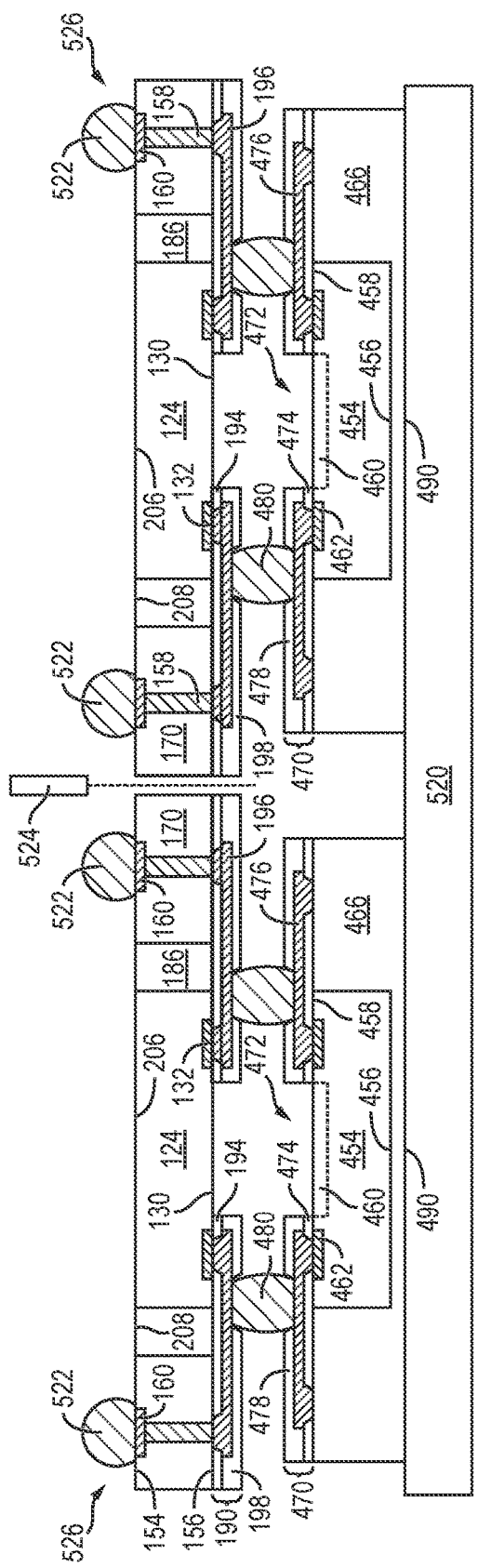

In FIG. 16c, reconstituted panel 184 is singulated with saw blade or laser cutting device 524 through modular interconnect units 170 and interconnect structure 190 into individual semiconductor devices or PoP devices 526.

Figure 16D:
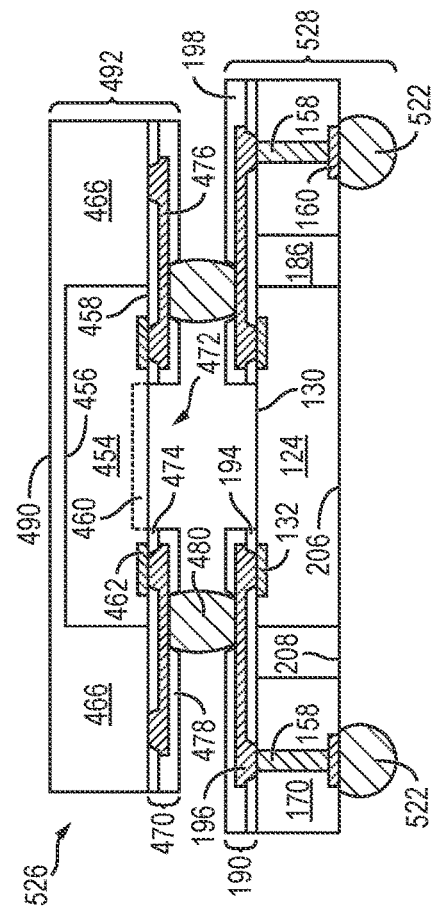

FIG. 16d shows PoP device 526 after singulation. PoP device 526 includes top PoP 492 mounted over interconnect structure 190 of a bottom PoP 528. Bottom PoP 528 is similar to bottom PoP 234 from FIG. 4k. Bottom PoP 528 includes semiconductor die 124 and modular interconnect units 170 disposed adjacent to semiconductor die 124 with encapsulant 186 formed around semiconductor die 124. Semiconductor die 454 electrically connects to semiconductor die 124 and modular interconnect units 170 through interconnect structure 470, bumps 480, and interconnect structure 190. Semiconductor die 124 and 454 electrically connect to external devices through interconnect structure 190, modular interconnect units 170, and bumps 522. Modular interconnect units 170 provide electrical routing and reduce the amount of additional RDL formed over bottom PoP 528. Thus, a height of bottom PoP 528 in PoP device 526 is reduced.

PoP device 526 operates as a MEMS device with integrated MEMS and ASIC semiconductor die. In one embodiment, semiconductor die 124 includes an ASIC and semiconductor die 454 includes a MEMS or other active or passive sensors responsive to various external stimuli. In another embodiment, semiconductor die 454 includes an ASIC and semiconductor die 124 includes a MEMS. PoP device 526 includes dimensions similar to PoP device 498 from FIG. 15b and may include a total height of approximately 760 μm or less. Assembling PoP device 526 at the wafer-level reduces the cost to manufacture PoP device 526.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a first semiconductor die;
   disposing a modular interconnect structure adjacent to the first semiconductor die;
   depositing a first encapsulant over the first semiconductor die and modular interconnect structure;
   forming a build-up interconnect structure over the first semiconductor die, modular interconnect structure, and first encapsulant;
   disposing a second semiconductor die including a microelectromechanical system (MEMS) over the first semiconductor die opposite the build-up interconnect structure;
   disposing a lid over the second semiconductor die; and
   depositing a second encapsulant over the second semiconductor die and lid.

2. The method of claim 1, further including:
   forming a bond wire extending from the second semiconductor die to the modular interconnect structure; and
   depositing the second encapsulant over the bond wire.

3. The method of claim 1, further including disposing the lid on the second semiconductor die opposite the first semiconductor die.

4. The method of claim 1, further including disposing the lid on the second semiconductor die over the MEMS.

5. The method of claim 1, wherein the first encapsulant extends between the first semiconductor die and second semiconductor die.

6. A method of making a semiconductor device, comprising:
   providing a first semiconductor die;
   forming a build-up interconnect structure over the first semiconductor die;
   forming a warpage balance layer over the first semiconductor die opposite the build-up interconnect structure; and
   disposing a second semiconductor die over the first semiconductor die, wherein the first semiconductor die or second semiconductor die includes a microelectromechanical system (MEMS).

7. The method of claim 6, further including forming an opening in the build-up interconnect structure over the first semiconductor die.

8. The method of claim 6, further including disposing a lid over the MEMS.

9. The method of claim 6, further including disposing a modular interconnect structure adjacent to the first semiconductor die.

10. The method of claim 9, wherein the build-up interconnect structure electrically couples the modular interconnect structure to the first semiconductor die and second semiconductor die.

11. The method of claim 6, further including depositing an encapsulant around the first semiconductor die.

12. A semiconductor device, comprising:
    a first semiconductor die;
    a modular interconnect structure disposed adjacent to the first semiconductor die;
    a first encapsulant deposited over the first semiconductor die and modular interconnect structure;
    a build-up interconnect structure formed over the first semiconductor die, modular interconnect structure, and first encapsulant;
    a second semiconductor die including a microelectromechanical system (MEMS) disposed over the first semiconductor die opposite the build-up interconnect structure;
    a lid disposed over the second semiconductor die; and
    a second encapsulant deposited over the second semiconductor die and lid.

13. The semiconductor device of claim 12, further including a bond wire extending from the second semiconductor die to the modular interconnect structure within the second encapsulant.

14. The semiconductor device of claim 12, wherein the lid is disposed over the second semiconductor die opposite the first semiconductor die.

15. The semiconductor device of claim 12, a wherein the lid is disposed on the second semiconductor die over the MEMS.

16. The semiconductor device of claim 12, wherein the first encapsulant extends between the first semiconductor die and second semiconductor die.

17. A semiconductor device, comprising:
    a first semiconductor die;
    a build-up interconnect structure formed over the first semiconductor die;
    a warpage balance layer disposed over the first semiconductor die opposite the build-up interconnect structure; and
    a second semiconductor die disposed over the first semiconductor die, wherein the first semiconductor die or second semiconductor die includes a microelectromechanical system (MEMS).

18. The semiconductor device of claim 17, further including an opening formed in the build-up interconnect structure over the first semiconductor die.

19. The semiconductor device of claim 17, further including a lid disposed over the MEMS.

20. The semiconductor device of claim 17, further including a modular interconnect structure disposed adjacent to the first semiconductor die.

21. The semiconductor device of claim 20, wherein the build-up interconnect structure electrically couples the modular interconnect structure to the first semiconductor die and second semiconductor die.

* * * * *